US007390707B2

(12) United States Patent
Kawamura et al.

(10) Patent No.: US 7,390,707 B2
(45) Date of Patent: Jun. 24, 2008

(54) SEMICONDUCTOR DEVICE FABRICATION METHOD

(75) Inventors: Kazuo Kawamura, Kawasaki (JP); Yosuke Shimamune, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 289 days.

(21) Appl. No.: 11/220,865

(22) Filed: Sep. 8, 2005

(65) Prior Publication Data

US 2006/0281288 A1     Dec. 14, 2006

(30) Foreign Application Priority Data

Jun. 13, 2005    (JP) .............................. 2005-172035

(51) Int. Cl.
*H01L 21/336* (2006.01)
(52) U.S. Cl. ...................................... 438/197; 438/300
(58) Field of Classification Search ................ 438/197, 438/648, 649, 651, 655, 300
See application file for complete search history.

(56) References Cited

U.S. PATENT DOCUMENTS

| 6,255,214 | B1 * | 7/2001 | Wieczorek et al. ........... 438/659 |
| 6,621,131 | B2 | 9/2003 | Murthy et al. |
| 2003/0124781 | A1 | 7/2003 | Lee et al. |
| 2004/0087121 | A1 * | 5/2004 | Kammler et al. ............. 438/528 |
| 2007/0032026 | A1 * | 2/2007 | Ong et al. .................... 438/301 |

FOREIGN PATENT DOCUMENTS

| JP | 9-251967 | 9/1997 |
| JP | 2001-53027 | 2/2001 |
| JP | 2002-237466 | 8/2002 |

OTHER PUBLICATIONS

J. Seger et al.; "Morphological instability of $NiSi_{1-u}Ge_u$ on single-crystal and polycrystalline $Si_{1-x}Ge_x$", Journal of Applied Physics, vol. 96, No. 4, Aug. 15, 2004, pp. 1919-1928.

Anne Lauwers et al.; "Materials aspects, electrical performance, and scalability of Ni silicide towards sub-0.13 μm technologies", American Vacuum Society, J. Vac. Sci. Technol. vol. 19, No. 6, Nov./Dec. 2001, pp. 2026-2037.

Chinese Office Action dated Feb. 29, 2008 issued in corresponding Application No. 200510107112.8.

* cited by examiner

*Primary Examiner*—Tuan H Nguyen
(74) *Attorney, Agent, or Firm*—Westerman, Hattori, Daniels & Adrian, LLP.

(57) ABSTRACT

The semiconductor device fabrication method comprising the step of forming a gate electrode on a semiconductor substrate; the step of forming a source/drain diffused layer in the semiconductor substrate on both sides of the gate electrode; the step of burying a silicon germanium layer in the source/drain diffused layer; the step of forming an amorphous layer at an upper part of the silicon germanium layer; the step of forming a nickel film on the amorphous layer; and the step of making thermal processing to react the nickel film and the amorphous layer with each other to form a silicide film on the silicon germanium layer.

13 Claims, 32 Drawing Sheets 12  14

14  12

SEMICONDUCTOR DEVICE FABRICATION METHOD

CROSS-REFERENCE TO RELATED APPLICATION

This application is based upon and claims priority of Japanese Patent Application No. 2005-172035, filed on Jun. 13, 2005, the contents being incorporated herein by reference.

BACKGROUND OF THE INVENTION

The present invention relates to a semiconductor device fabrication method, more specifically a semiconductor device fabrication method in which silicidation is made by using nickel.

As a technique for making gate electrodes and source/drain diffused layers low resistive, the so-called SALICIDE (Self-Aligned Silicide) process is known.

In the SALICIDE process, as a metal material to be reacted with silicon, cobalt (Co) is dominantly used (refer to Patent Reference 1).

Recently, as semiconductor devices are increasingly micronized, the gate length tends to be much shorter.

In siliciding gate electrodes of a very short gate length with cobalt film, the phenomena that the scatter of a resistance of the gate electrodes is abruptly increase has been confirmed.

Nickel silicide is much noted for the merit that, when the gate length of gate electrodes is very short, nickel silicide makes the resistance scatter of the gate electrodes very small in contrast to such cobalt silicide.

On the other hand, the mobility of carriers (holes) of PMOS transistors is lower than that of carriers (electrons) of NMOS transistors. When PMOS transistors are simply formed, often the PMOS transistors cannot have sufficiently high operation speed.

Then, a technique that a silicon germanium layer ($Si_{1-x}Ge_x$ layer) is buried in the source/drain regions of the PMOS transistors to apply compression strain to the channel regions of the PMOS transistors, whereby the mobility of the carriers (holes) in the PMOS transistors is improved to improve the operation speed of the PMOS transistors is proposed (refer to Patent Reference 2).

Following references disclose the background art of the present invention.

[Patent Reference 1]
Specification of Japanese Patent Application Unexamined Publication No. Hei 9-251967

[Patent Reference 2]
Specification of U.S. Pat. No. 6,621,131

[Patent Reference 3]
Specification of Japanese Patent Application Unexamined Publication No. 2002-237466

[Patent Reference 4]
Specification of Japanese Patent Application Unexamined Publication No. 2001-53027

[Non-Patent Reference 1]
J. Seger et al., "Morphological instability of $NiSi_{1-u}Ge_u$ on single-crystal and polycrystalline $Si_{1-x}Ge_x$", J. Appl. Phys., Vol. 96, No. 4, pp. 1919-1928 (2004)

[Non-Patent Reference 2]
Anne Lauwers et al., "Materials aspects, electrical performance, and scalability of Ni silicide towards sub-0.13 μm technologies", J. Vac. Sci. Technol., B, Vol. 19, No. 6, pp. 2026-2037 (2001)

As semiconductor devices are increasingly micronized and integrated, the junction depth of the source/drain diffused layers becomes smaller. The nickel silicide film must be formed much thinner. When the silicide film is formed thick, the electric field between the junctions of the source/drain diffused layer and the silicide film becomes stronger, which increases the junction leak current.

However, when thin nickel film is simply used to silicide the silicon germanium layer, often the sheet resistance is increased. When thin nickel film is simply used to silicide the silicon germanium layer, $Ni(Si_{1-x}Ge_x)_2$ crystals are formed in spikes below the silicide film down to the vicinity of the junctions of the source/drain diffused layer, which often increases the junction leak current.

SUMMARY OF THE INVENTION

An object of the preset invention is to provide a semiconductor device fabrication method which can suppress the increase of the sheet resistance and the junction leak current even when the silicon germanium layer is silicided with thin nickel film.

According to one aspect of the present invention, there is provided a semiconductor device fabrication method comprising the steps of: forming a gate electrode over a semiconductor substrate; forming a source/drain diffused layer in the semiconductor substrate on both sides of the gate electrode; burying a silicon germanium layer in the source/drain diffused layer; forming an amorphous layer at an upper part of the silicon germanium layer; forming a nickel film on the amorphous layer; and making thermal processing to react the nickel film and the amorphous layer with each other to form a silicide film on the silicon germanium layer.

According to the present invention, the amorphous layer is formed on the silicon germanium layer, and thus formed amorphous layer is reacted with the nickel film to thereby form the nickel silicide film. Because of no crystal boundaries in the amorphous layer to react with the nickel film, the silicidation homogeneously goes on. The silicidation, which homogeneously goes on, can prevent the generation of region where the nickel silicide is absent, on the silicon germanium layer. Because of no crystal faces in the amorphous layer, the $Ni(Si_{1-x}Ge_x)_2$ crystals are prevented from being formed in spikes. Thus, according to the present invention, even when the silicon germanium layer is silicided by using a thin nickel film, the sheet resistance can be low, and the junction leak current can be suppressed. Furthermore, according to the present invention, compression strain is applied to the channel region by the silicon germanium layer buried in the source/drain diffused region, whereby the operation speed of PMOS transistors can be improved. Thus, the present invention can provide a semiconductor device having good electric characteristics.

DETAILED DESCRIPTION OF THE INVENTION

[Principle of the Present Invention]

The principle of the present invention will be explained with reference to drawings.

Figure 1:
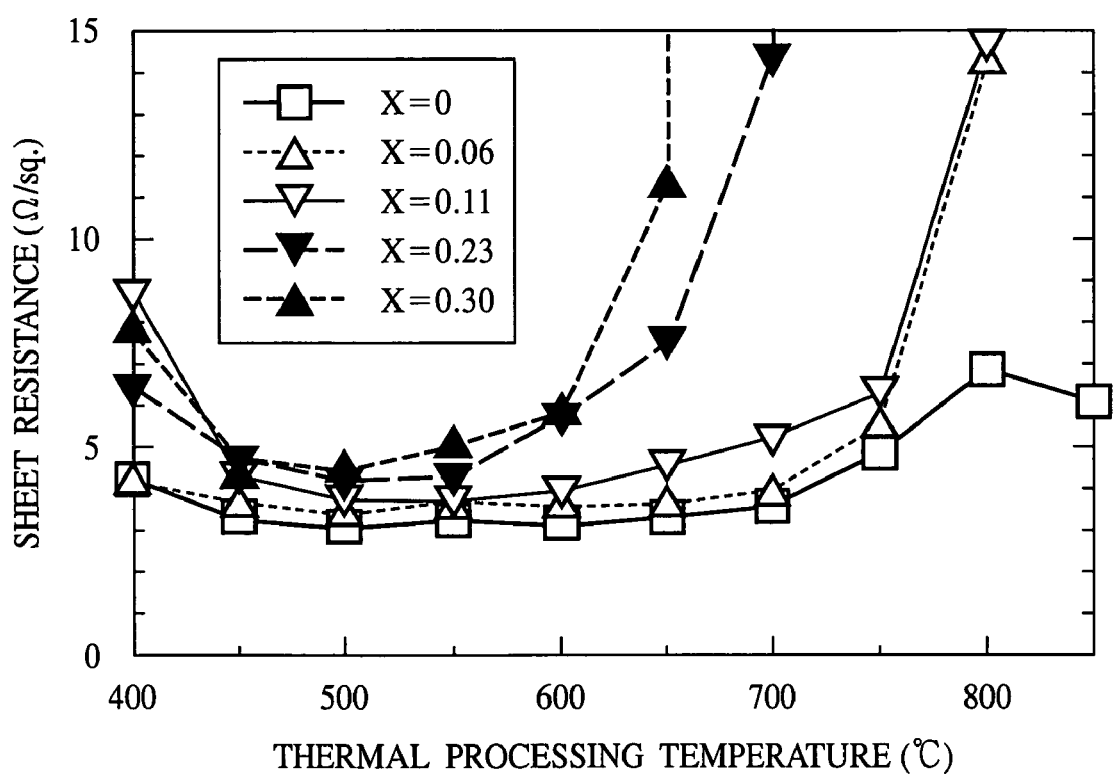
FIG. 1 is a graph of relationships between the thermal processing temperature, the Ge composition ratio and the sheet resistance in siliciding silicon germanium layer with a thin nickel film.

FIG. 1 is a graph of the relationships among the thermal processing temperature, Ge composition ratio and sheet resistance in siliciding silicon germanium layer with thin nickel film. More specifically, in the silicidation in which silicon germanium layer ($Si_{1-x}Ge_x$ layer) was formed on a (100) silicon substrate, a 20 nm-thickness Ni film was formed on the silicon germanium layer, and thermal processing for reacting the silicon germanium layer and the Ni film with each other to form silicide film was made for 30 second. The graph of FIG. 1 is described in Non-Patent Reference 1. On the horizontal axis, the thermal processing temperature for the silicidation is taken, and the sheet resistance is taken on the vertical axis. The □ marks indicate the case that the Ge composition ratio X is 0, the △ marks indicate the case that the Ge composition ratio X is 0.06, the ▽ marks indicate the case that the Ge composition ratio is 0.11, and the ▼ marks indicate the case that the Ge composition ration X is 0.23, and the ▲ marks indicate the case that the Ge composition ration X is 0.30.

As seen in FIG. 1, as the Ge composition ratio X is larger, the thermal processing temperature at which the sheet resistance is conspicuously increased tends to lower.

Based on this, it is found that when a silicon germanium layer is buried in a source/drain diffused layer and formed on the gate electrode, and the silicon germanium layer is silicided simply with a nickel film, the sheet resistance of the source/drain diffused layer and the gate electrode is increased.

The sheet resistance of the nickel silicide film being increased when the silicon germanium film is silicided with the nickel film will be due to that the silicide coheres, and regions where the silicide is absent are formed.

Figure 2A:
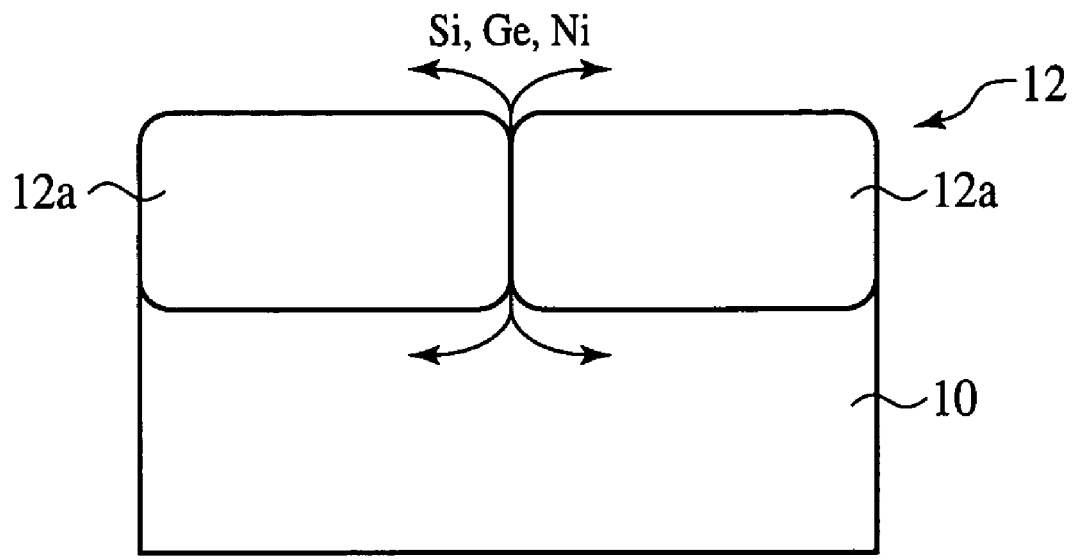
FIGS. 2A and 2B are conceptual views of the mechanism for forming regions where the silicide is absent.
Figure 2B:
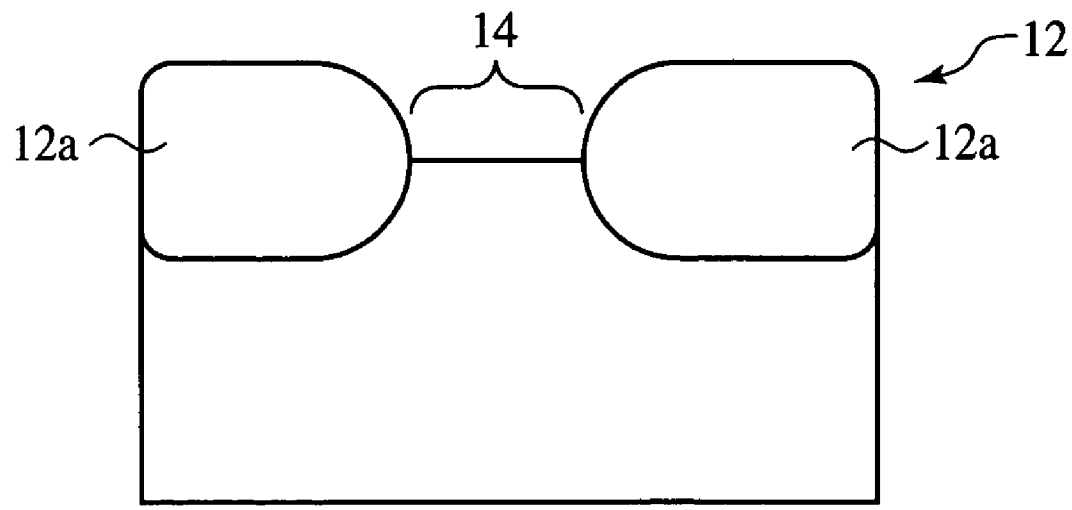

FIGS. 2A and 2B are a conceptual view of the mechanism for forming the regions where the silicide is absent.

A nickel film is formed on a silicon germanium layer 10, and thermal processing is made to react the silicon germanium layer 10 and the nickel film with each other. Then, as illustrated in FIGS. 2A and 2B, crystal grains 12a of Ni ($Si_{1-x}Ge_x$) are formed on the silicon germanium layer 10. As the thermal processing further advances, the Si, Ge and Ni which are the constituent atoms of the silicon germanium layer 10 and the crystal grains 12 are diffused along the interfaces (crystal grain boundaries) between the crystal grains 12a, the interfaces between the crystal grains 12a and the silicon germanium layer 10, and the surfaces of the crystal grains 12a. Especially, Ge is diffusible. The shape of the crystal grains 12a is becoming spheres, which are stable in terms of energy. Then, regions 14 where the crystal grains 12a are absent, i.e., the silicide is absent are formed in the surface of the silicon germanium layer 10. This phenomena is called agglomeration. As described above, when the silicon germanium layer is silicided simply with the nickel film, the regions 14 where the crystal grain forming the nickel silcide film 12 are absent are formed, and the sheet resistance is increased.

As described above with reference to FIG. 1, when the nickel film is formed in a 20 nm-thickness on the silicon germanium layer, and the nickel film is silicided, the thickness of the nickel silicide film becomes about 45 nm. Recently, semiconductor devices are increasingly integrated and micronized, and for the 65 nm-node technology, the junction depth of the source/drain diffused layer must be as shallow as below 90 nm. To make the junction depth of the source/drain diffused layer below 90 nm, the thickness of the nickel silicide film must be 26 nm or below. This is because when the thickness of the nickel silicide film is too large, strong electric fields are applied in the regions between the junction regions of the source/drain diffused layer and the nickel silicide film, which causes the increase of the leak current. To make the nickel silicide film in the thickness of 26 nm or below, it is necessary to set the thickness of the Ni film to be formed on the silicon germanium to be as small as 12 nm or below.

Figure 3:
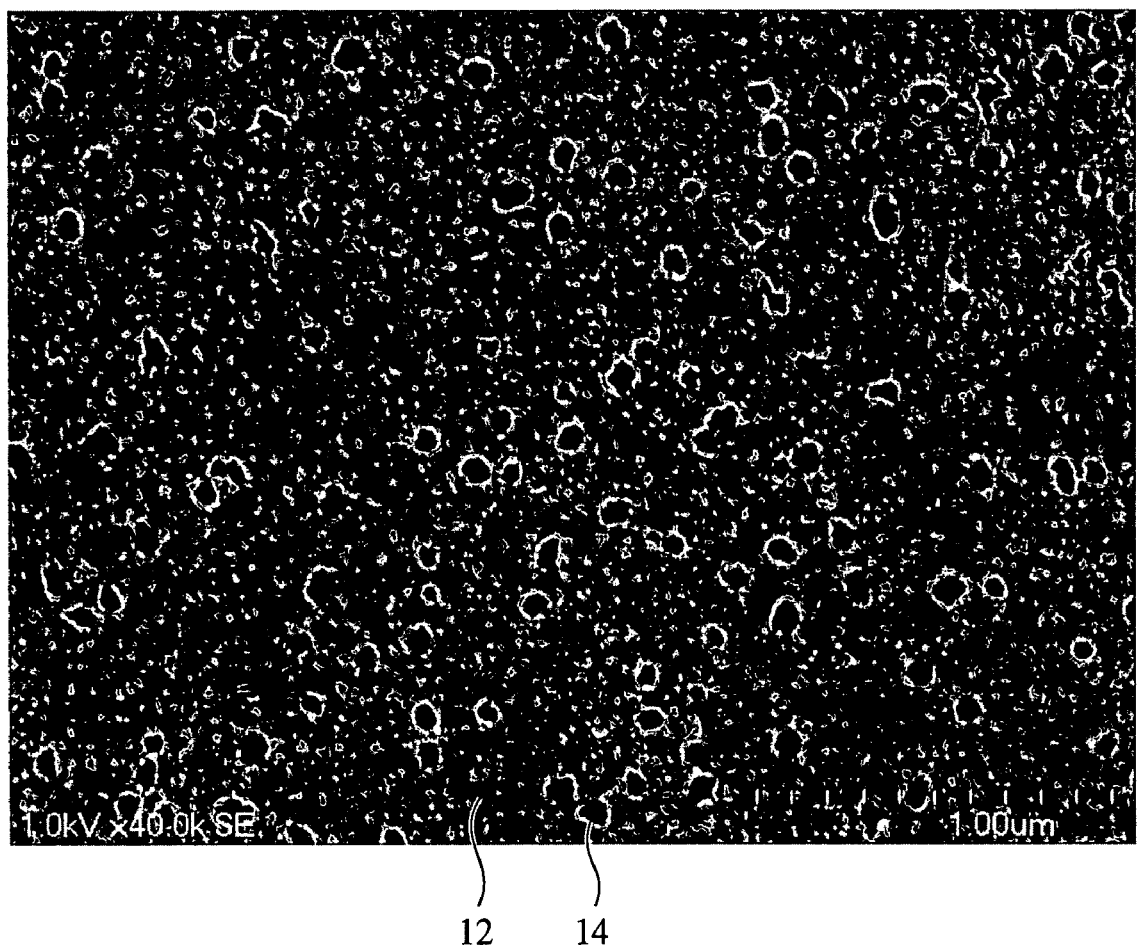
FIG. 3 is a plan view (Part 1) of an SEM image of the nickel silicide film.

FIG. 3 is a plan view of an SEM (Scanning Electron Microscope) image of the silicide film formed by forming a 10 nm-thickness nickel film on a silicon germanium layer, making thermal processing of the first temperature to react the silicon germanium layer and the nickel film to form nickel silicide film, etching off the non-reacted nickel film by sequentially using APM (Ammonia-Hydrogen Peroxide Mixture) liquid and SPM (Sulfuric acid-Hydrogen Peroxide Mixture) liquid and then further making thermal processing of the second temperature which is higher than the first temperature.

The specific processing for forming the sample shown in FIG. 3 is as follows. On a (100) silicon substrate, a silicon germanium layer ($Si_{1-x}Ge_x$ layer) of a 0.24 Ge composition ratio X was formed. Then, on the silicon germanium layer, a 10 nm-thickness nickel film and a 10 nm-thickness TiN film were sequentially formed. Then, thermal processing (the first thermal processing) of 400° C. and 30 seconds was made to react the silicon germanium layer and the nickel film, and a nickel silicide (Ni($Si_{1-x}Ge_x$) film) was formed. Then, the non-reacted nickel film was etched off by sequentially using APM liquid and SPM liquid. The APM liquid is a chemical liquid mixing ammonium, hydrogen peroxide and water. The SPM liquid is a chemical liquid mixing sulfuric acid and hydrogen peroxide. Thermal processing (the second thermal processing) of 500° C. and 30 second was further made. The thus formed nickel silicide film was observed by SEM, and the SEM image as shown in FIG. 3 was obtained.

In FIG. 3, in the darker portions 14, the nickel silicide film 12 is absent, and the surface of the silicon germanium layer 10 (see FIGS. 2A and 2B) is exposed.

As seen in FIG. 3, when the nickel silicide film 12 is formed as described above, a large number of the portions 14, where the nickel silicide film is absent, are formed, and the nickel silicide film cannot be of good quality. The sheet resistance was measured on the nickel silicide film shown in FIG. 3, and the sheet resistance was 24 Ω/square.

Figure 4:
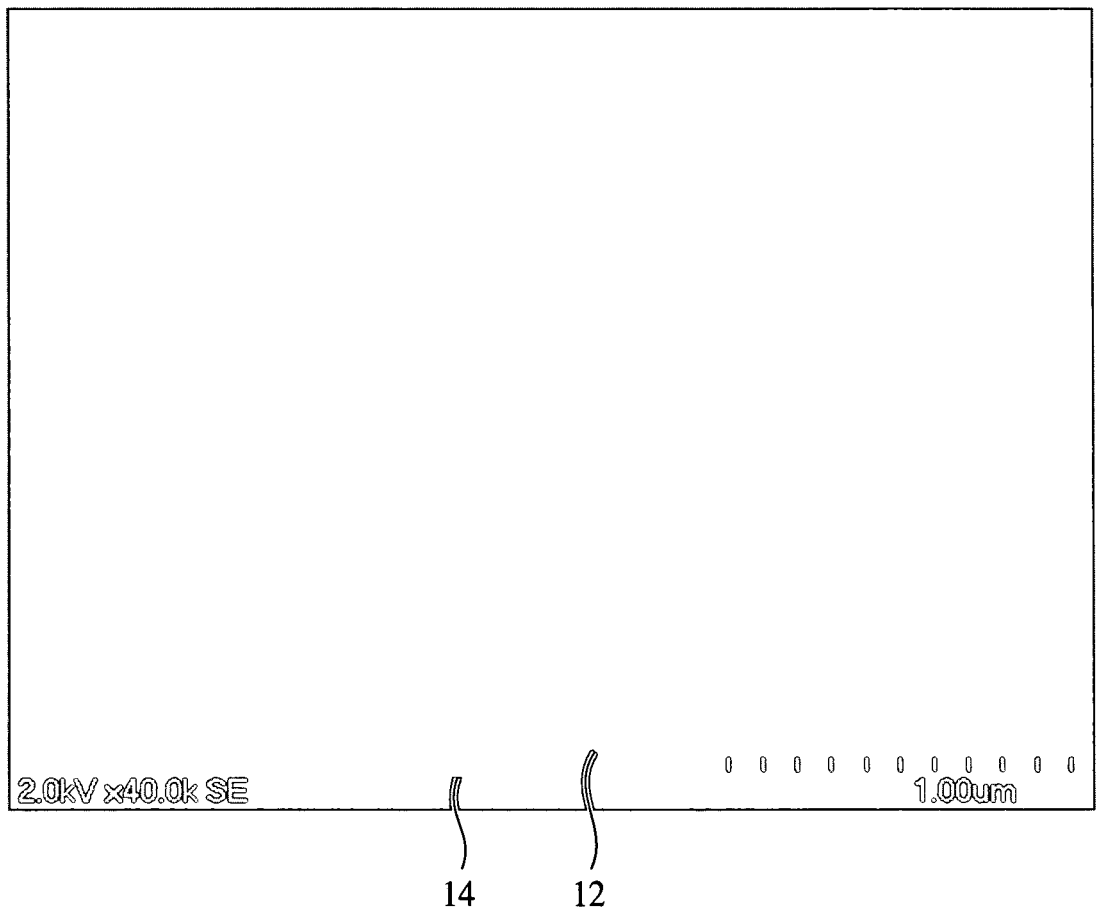
FIG. 4 is a plan view (Part 2) of an SEM image of the nickel silicide film.

FIG. 4 is a plan view of an SEM image of a silicide film formed by forming a 10 nm-thickness nickel film on a silicon germanium layer, making thermal processing to react the silicon germanium layer and the nickel film to form a nickel silicide film, and etching off the non-reacted nickel film by using SPM liquid. That is, FIG. 4 is a plan view of an SEM image of the silicide film formed by forming the 10 nm-thickness nickel film on the silicon germanium layer, making the thermal processing of the first temperature to react the silicon germanium layer and the nickel layer to form the nickel silicide film, etching off the non-reacted Ni film by SPM liquid alone, and making no thermal processing of a temperature higher than the first temperature.

The specific process for forming the sample shown in FIG. 4 is as follows. On a (100) silicon substrate, a silicon germanium layer ($Si_{1-x}Ge_x$ layer) of a 0.24 Ge composition ratio X was formed. Then, on the silicon germanium layer, a 10 nm-thickness nickel film and a 10 nm-thickness TiN film were sequentially formed. Then, thermal processing of 400° C. and 30 seconds was made to react the silicon germanium layer and the nickel film, and a nickel silicide was formed. Then, the non-reacted nickel film was etched off by using SPM liquid. The chemical liquid processing using APM liquid was not made. The thermal processing of 500° C. and 30 seconds was not made after the non-reacted nickel film has been etched off. The thus formed nickel silicide film was observed by SEM, and the SEM image as shown in FIG. 4 was obtained.

As seen in FIG. 4, when the nickel silicide film 12 was formed as described above, the portions 14, where the nickel silicide film is absent, were decreased in the number and furthermore, reduced in the size.

Based on the above, the portions 14, where the nickel silicide film is absent, can be decreased in the number and the size by making no chemical processing using APM liquid and no high temperature thermal processing of 500° C.

The sheet resistance was measured on the nickel silicide film 12 shown in FIG. 4, and the sheet resistance was 12 Ω/square. It is found that the thus formed nickel silicide film 12 can have the sheet resistance lowered.

However, it cannot be said that the sizes of all the portions 14 in FIG. 4, where the nickel silicide film is absent, are not small enough in comparison with the sizes of the source drain regions and the gate electrode of actual semiconductor devices. Accordingly, in fabricating a semiconductor device, when the portions 14, where the nickel silicide film is absent, are located on the source/drain regions and the gate electrode, the contact resistance on the source/drain and the resistance of the gate line are increased. Thus, in order to fabricate a semiconductor device of good electric characteristics with high yields it is important to form no portions 14, where the silicon germanium layer is absent.

When a silicon germanium layer is buried in a silicon substrate, a nickel film is formed thin on the silicon germanium layer, and thermal processing for the silicidation is made, $Ni(Si_{1-x}Ge_x)_2$ crystals are formed in spikes along the (111) faces of the crystals forming the silicon germanium layer.

Figure 5:
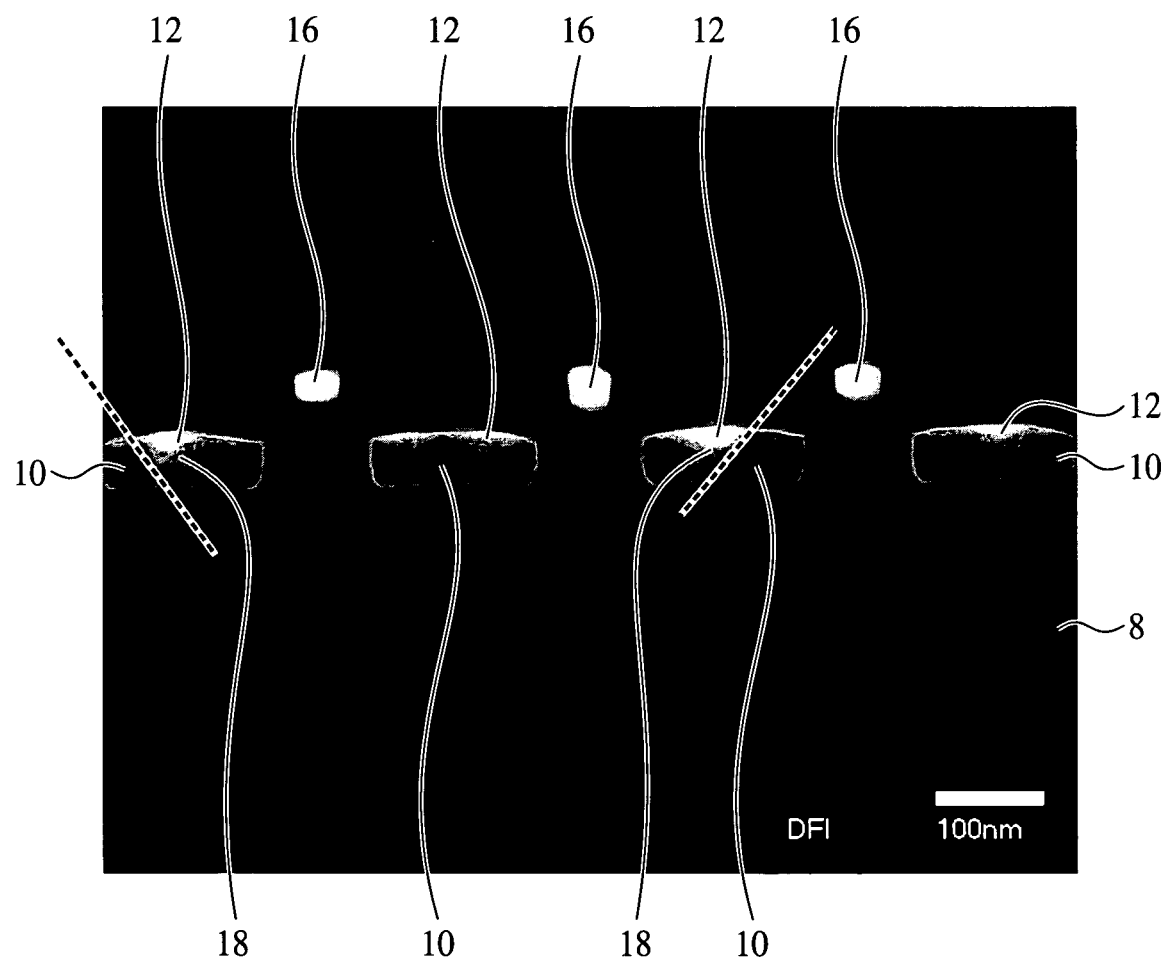
FIG. 5 is a sectional view showing the $Ni(Si_{1-x}Ge_x)_2$ crystals formed in spikes.

FIG. 5 is a sectional view showing $Ni(Si_{1-x}Ge_x)_2$ crystals formed in spikes along the (111) faces of the crystals forming the silicon germanium layer. FIG. 5 is a dark field image observed by using an STEM (Scanning Transmission Electron Microscope). In dark field images, where diffracted wavers and scattered waves are observed, the portions where the silicide is present are shown bright. The dot lines in FIG. 5 indicate the (111) faces of crystals forming the silicon germanium layer.

The sample shown in FIG. 5 was formed as follows. First, gate electrodes 16 were formed on a (100) silicon substrate 8 with a gate insulation film formed therebetween. Next, a silicon germanium layer 10 was buried in the silicon substrate 8 on both sides of the gate electrodes 16. Then, a 12 nm-thickness nickel film was formed on the silicon germanium layer 10. Then, thermal processing of 400° C. and 30 seconds was made to react the silicon germanium layer and the nickel film to form a nickel silicide film. Then, the non-reacted Ni film was etched off. Next, thermal processing of 500° C. of 30 seconds was made.

As seen in FIG. 5, at the bottom part pf the nickel silicide film 12, $Ni(Si_{1-x}Ge_x)_2$ crystals 18 are formed in spikes along the (111) faces of the crystals forming the silicon germanium layer 10.

As described above, when the silicon germanium layer 10 is silicided simply by using the thin nickel film, the $Ni(Si_{1-x}Ge_x)$ crystals 18 are formed in spikes along the crystal faces of the silicon germanium layer 10. The $Ni(Si_{1-x}Ge_x)_2$ crystals 18 formed in spikes below the nickel silicide film 12 often arrives even at the vicinities of the junctions of the source/drain diffused layer (not shown), and the junction leak current is increased.

The inventors of the present application have made earnest studies and obtained an idea that an upper part of the silicon germanium layer is made amorphous to thereby form an amorphous layer of the amorphous silicon germanium on the upper part of the silicon germanium layer, and the amorphous layer is reacted with the nickel layer to thereby form a nickel silcide film.

FIGS. 6A to 6E are sectional views illustrating the principle of the present invention.

Figure 6A:
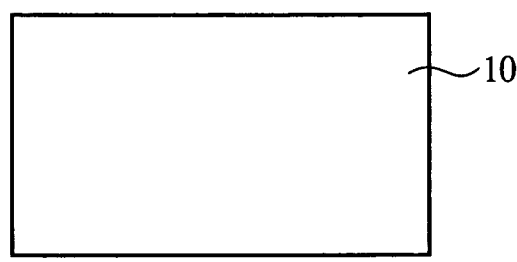
FIGS. 6A to 6E are sectional views illustrating the principle of the present invention.
Figure 6B:
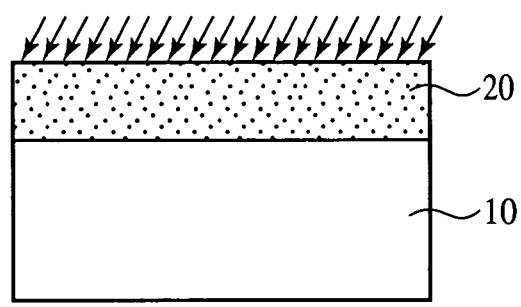

First, a silicon germanium layer $(Si_{1-x}Ge_x)$ layer 10 with a dopant impurity, such as boron or others, is formed in trenches (not illustrated) formed in a (100) silicon substrate (not illustrated) (see FIG. 6A).

Then, ions are implanted in an upper part of the silicon germanium layer 10 to make the upper part of the silicon germanium layer 10 amorphous. An amorphous layer 20 of amorphous silicon germanium is formed on the upper part of the silicon germanium layer 10 (see FIG. 6B).

Figure 6C:
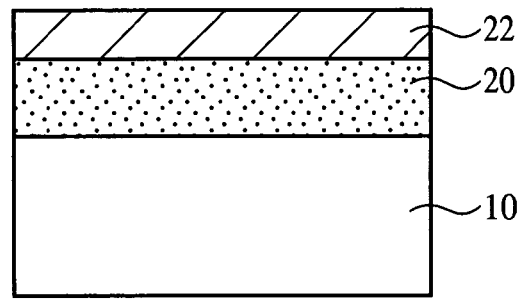

Next, a nickel film 22 of, e.g., a 10 nm-thickness is formed on the amorphous layer 20 (see FIG. 6C).

Figure 6D:
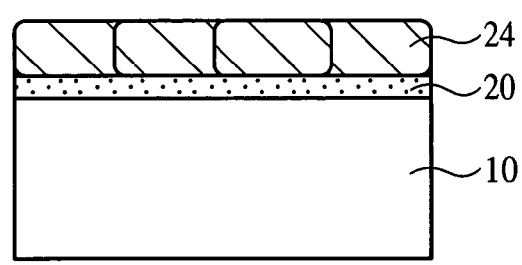
Figure 6E:
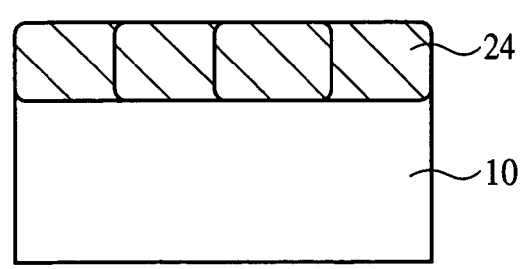

Then, thermal processing is made to react the silicon germanium layer 10 and the nickel film 22 with each other. As illustrated in FIGS. 6D and 6E, the silicidation gradually goes on, and the thermal processing is stopped when the silicidation of the amorphous layer 20 is completed, i.e., the undersurface of the silicide layer 24 arrives at the upper surface of the silicon germanium layer 10. On the early stage of the thermal processing (see FIG. 6D), the nickel silicide film 24 of $Ni_2(Si_{1-x}Ge_x)$ phase is formed, and finally the nickel silicide film 24 of $Ni(Si_{1-x}Ge_x)$ phase is formed (see FIG. 6E). The nickel silicide film 24 of $Ni_2(Si_{1-x}Ge_x)$ phase is formed on the early stage of the thermal processing, because the supply amount of the Ni is larger with respect to the supply amounts of Si and Ge. The nickel silicide film 24 is thus formed on the silicon germanium layer 10.

According to the present invention, because of no crystal boundaries present in the amorphous layer 20, which reacts with the nickel film, i.e., the silicon germanium layer 20 in the part made amorphous, the silicidation homogenously goes on. The silicidation, which homogeneously goes on, can prevent the generation of the regions 14 (see FIG. 2B), where the nickel silicide is absent. Because of no crystal faces in the part of the silicon germanium layer 20 made amorphous, the formation of $Ni(Si_{1-x}Ge_x)_2$ crystals in spikes can be prevented. Thus, according to the present invention, even when the silicon germanium layer is silicided with the nickel film formed thin to thereby form the nickel silicide film, the sheet resistance can be low, and the junction leak current can be suppressed.

Figure 7:
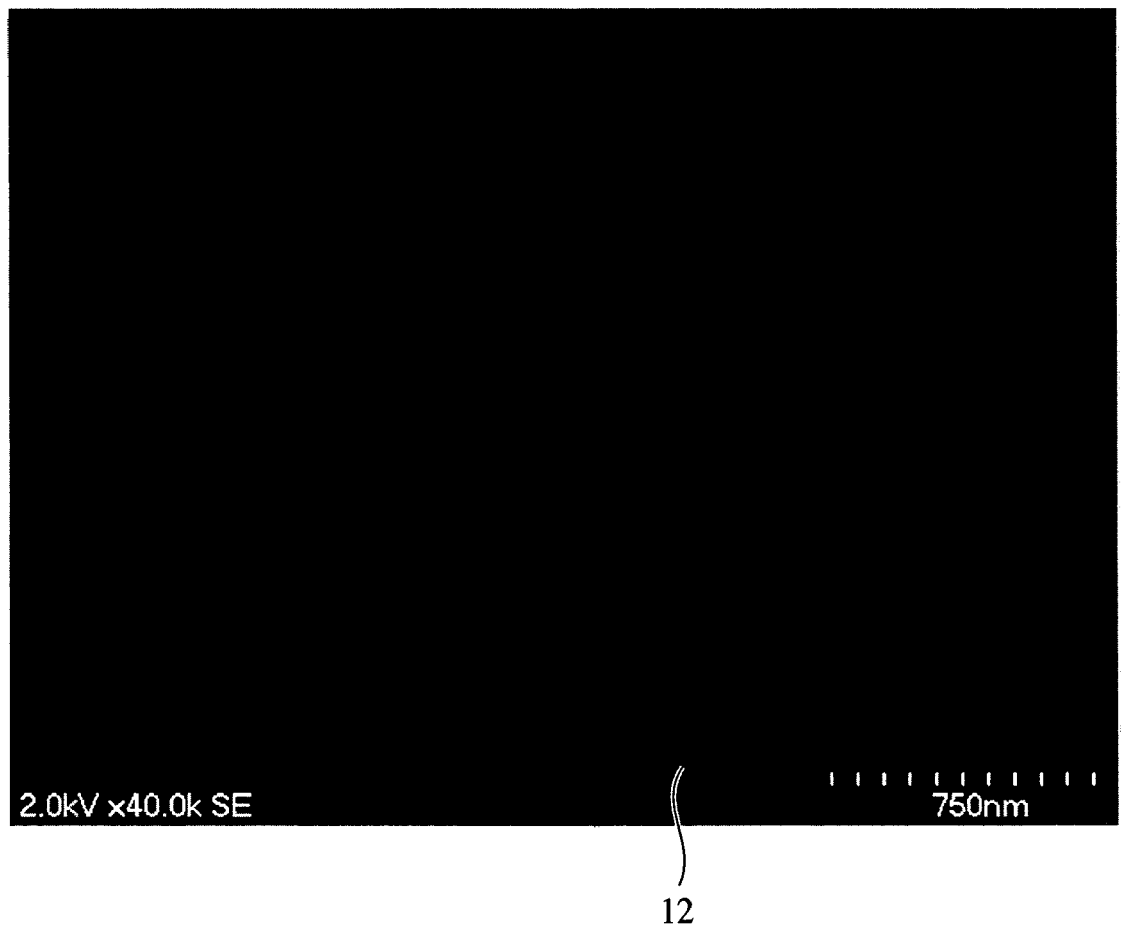
FIG. 7 is a plan view of an SEM image of the nickel silicide film formed by the fabrication method according to the present invention.

FIG. 7 is a plan view of an SEM image of the nickel silicide film formed by the fabrication method according to the present invention.

When the nickel silicide film 12 is formed as illustrated in FIGS. 6A to 6E, no portions where the nickel silicide is absent are formed in the nickel silicide film 12 as shown in FIG. 7.

The sheet resistance was measured on the nickel silicide film 12 as shown in FIG. 7, and the sheet resistance was 12 Ω/square.

Based on the above, it can be found that the nickel silicide film 12 is formed as illustrated in FIGS. 6A to 6E, whereby the nickel silicide film 12 can have very high quality and low sheet resistance.

When the thickness of the amorphous layer 20 is too large, the following takes place.

FIGS. 8A to 8E are sectional views illustrating the case that the amorphous layer is formed too thick.

Figure 8A:
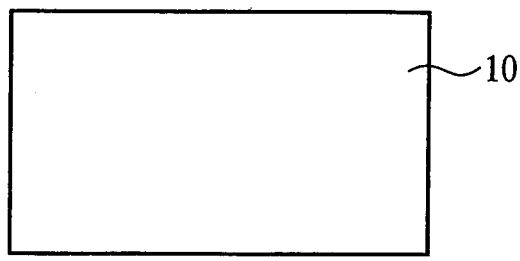
FIGS. 8A to 8E are sectional views illustrating the case with the amorphous layer made too thick.
Figure 8B:
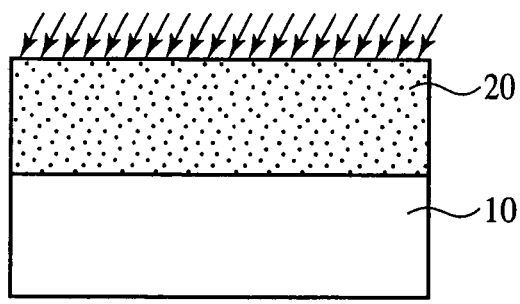
Figure 8C:
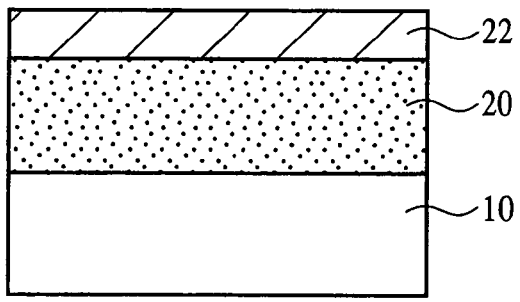

First, a silicon germanium layer 10 with a dopant impurity, such as boron or others, implanted or co-doped is formed in trenches (not illustrated) formed in a silicon substrate (not illustrated) (see FIG. 8A).

Then, ions are implanted in the upper part of the silicon germanium layer 10 to make the upper part of the silicon germanium layer amorphous. The acceleration energy for the ion implantation is set relatively high, whereby a relatively thick amorphous layer 20 is formed at upper part of the silicon germanium layer. An amorphous layer 20 of, e.g., a 40 nm-thickness is formed.

Next, a nickel film 22 is formed on the amorphous layer 20.

Figure 8D:
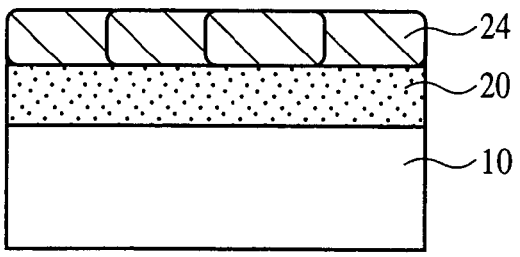
Figure 8E:
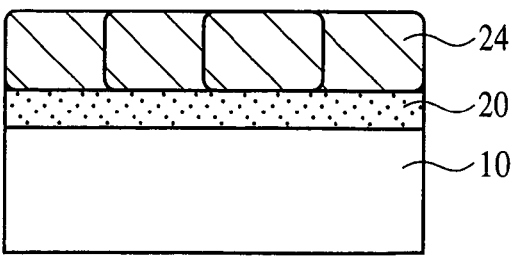
Figure 9A:
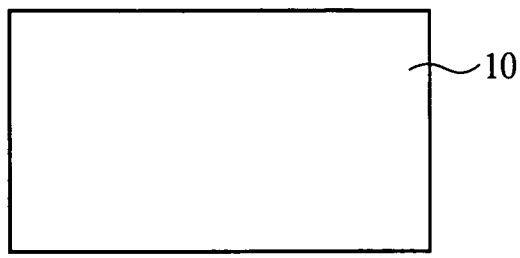
FIGS. 9A to 9E is sectional views illustrating the case with the amorphous layer made too thin.
Figure 9B:
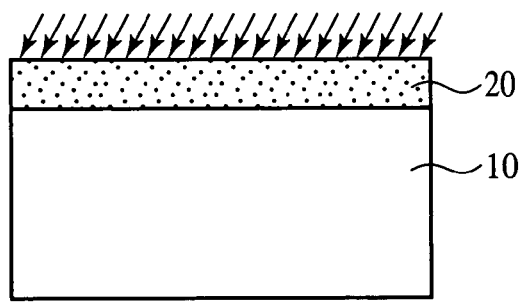
Figure 9C:
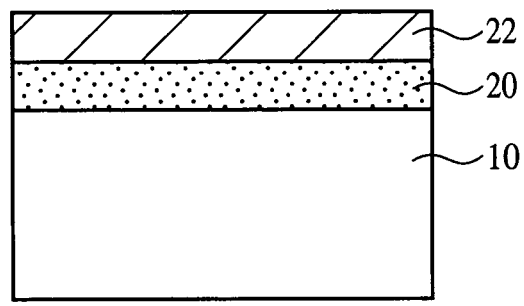
Figure 9D:
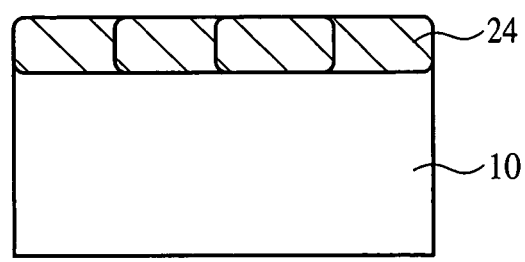
Figure 9E:
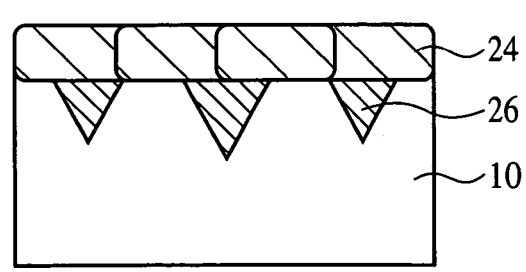

Next, thermal processing for reacting the silicon germanium layer 10 and the nickel layer 22 with each other is made. As illustrated in FIGS. 8D and 8E, the silicidation gradually goes on. On the early stage of the thermal processing (see FIG. 8D), a nickel silicide film 24 of $Ni_2(Si_{1-x}Ge_x)$ phase is formed, and finally a nickel silicide film 24 of $Ni(Si_{1-x}Ge_x)$ phase is formed (see FIG. 8E). Because of the amorphous layer 20 which is too thick with respect to the thickness of the nickel film 22, the amorphous layer 20 remains below the nickel silicide film 24.

The dopant impurity, such as boron or others, is not activated in the amorphous layer 20, and the electric resistance between the nickel silicide film 24 and the silicon germanium layer 10 becomes high. Accordingly, the too thick amorphous layer 20 makes it impossible to fabricate a transistor of good electric characteristics.

On the other hand, when the amorphous layer 20 is too thin, the follow takes place.

FIGS. 9A to 9E are sectional views illustrating the case that the thickness of the amorphous layer is too small.

First, a silicon germanium layer 10 with a dopant impurity implanted or co-doped is formed in trenches (not illustrated) formed in a silicon substrate (not illustrated).

Then, ions are implanted in the upper part of the silicon germanium layer 10 to make the upper part of the silicon germanium layer amorphous. The acceleration energy for the ion implantation is set relatively low, whereby a relatively thin amorphous layer 20 is formed on the silicon germanium layer. An amorphous layer 20 of, e.g., a 10 nm-thickness is formed.

Next, a nickel film 22 is formed on the amorphous layer 20.

Then, thermal processing for reacting the silicon germanium layer 10 and the nickel film 22 with each other is made. Because of the amorphous layer 20 which is too thick with respect to the thickness of the nickel film 22, the silicon germanium layer 10 in the part where the silicon germanium layer 10 has not been made amorphous, i.e., even the crystalline silicon germanium layer 10 is silicided. Therefore Ni $(Si_{1-x}Ge_x)_2$ crystals are grown in spikes long the (111) faces of the silicon germanium layer 10.

When the amorphous layer 20 is thus too thin, Ni $(Si_{1-x}Ge_x)_2$ crystals 26 are formed in spikes below the nickel silicide film 24. In this case, the distance between the junctions of the source/drain diffused layer and the nickel silicide films 24, 26 becomes small, and the electric field in the region between the junctions of the source/drain diffused layer and the nickel silicide films 24, 26 becomes strong, which increases the junction leak current.

Thus, the thickness of the amorphous layer 20 must be suitably set so that the amorphous layer 20 is not too thin or too thick.

A FIRST EMBODIMENT

Figure 10:
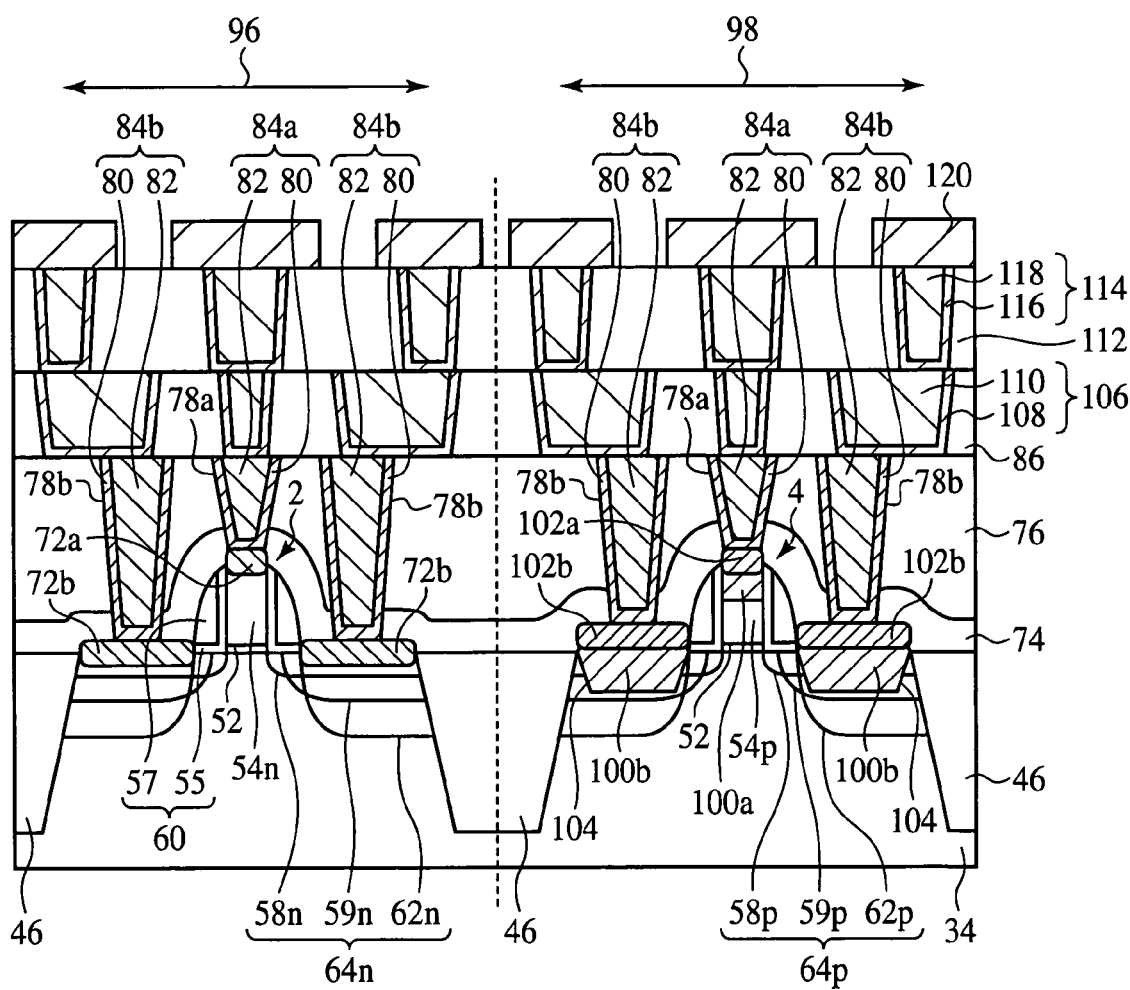
FIG. 10 is a sectional view of the semiconductor device according to the present embodiment, which illustrates a structure thereof.

The semiconductor device according to a first embodiment of the present invention and the method for fabricating the semiconductor device will be explained with reference to FIGS. 10 to 24. FIG. 10 is a sectional view of the semiconductor device according to the present embodiment, which illustrates a structure thereof.

(The Semiconductor Device)

First, the structure of the semiconductor device according to the present embodiment will be explained with reference to FIG. 10.

In FIG. 10, an NMOS transistor-to-be-formed region 96 is illustrated on the left side of the drawing, and on the right side of the drawing, a PMOS transistor-to-be-formed region 98 is illustrated.

Device isolation regions 46 for defining device regions are formed in a silicon substrate 34. Wells (not illustrated) are formed in the silicon substrate 34 with the device isolation regions 46 formed in.

In the NMOS transistor-to-be-formed region 96, on the silicon substrate 34 with the well formed in, a gate electrode 54n of polysilicon film is formed with a gate insulation film 52 of silicon oxide film formed therebetween.

On the gate electrode 54n, a nickel silicide film 72a of NiSi is formed. The film thickness of the nickel silicide film 72a is, e.g., 20 nm or below.

On the side wall of the gate electrode 54n with the nickel silicide film 72a formed on, a sidewall insulation film 60 of the two-layer structure of a silicon oxide film 55 and a silicon nitride film 57 is formed.

In the silicon substrate 34 on both sides of the gate electrode 54n, a source/drain diffused layer 64n having shallow impurity diffused regions 58n forming the extension regions of the extension source/drain structure, impurity diffused regions 59n for making the extension regions less resistive, and deep impurity diffused regions 62n is formed.

On the source/drain diffused layer 64n, a nickel silicide film 72b of NiSi is formed. The film thickness of the nickel silicide film 72b is, e.g., 20 nm or below.

Thus, on the silicon substrate 34 in the NMOS transistor-to-be-formed region 96, an NMOS transistor 2 including the gate electrode 54n and the source/drain diffused layer 64n is formed.

In the PMOS transistor-to-be-formed region 98, on the silicon substrate 34 with the well formed in, a gate electrode 54p of polysilicon film is formed with the gate insulation film 52 of silicon oxide film formed therebetween. The gate electrode 54p further includes on the polysilicon film an $Si_{1-x}Ge_x$ layer (silicon germanium layer) 100a having a composition ratio X of 0<X<1. The composition ratio of the $Si_{1-x}Ge_x$ layer 100a is, e.g., $Si_{0.76}Ge_{0.24}$. On the $Si_{1-x}Ge_x$ layer 100a of the gate electrode 54p, a nickel silicide film 102a of $NiSi_{1-x}Ge_x$ having a composition ratio X of 0<X<1. The composition ratio of the Ni to the $Si_{1-x}Ge_x$ of the $NiSi_{1-x}Ge_x$ forming the nickel silicide film 102a is 1:1. Specifically, the composition of the nickel silicide film 102a is, e.g., $NiSi_{0.76}Ge_{0.24}$. The film thickness of the nickel silicide film 102a is, e.g., 20 nm or below.

On the side wall of the gate electrode 54p with the nickel silicide film 102a formed on, the sidewall insulation film 60 of the two-layer structure of the silicon oxide film 55 and the silicon nitride film 57 is formed.

In the silicon substrate 34 on both sides of the gate electrode 54p, a source/drain diffused layer 64p having shallow impurity diffused regions 58p forming the extension regions of the extension source/drain structure, impurity diffused regions 69p for making the extension regions less resistive and deep impurity diffused regions 62p is formed.

Recesses 104 are formed in the source/drain diffused layer 64p on both sides of the gate electrode 54p and the sidewall insulation film 60. In the recesses 104, an $Si_{1-x}Ge_x$ layer (silicon germanium layer) 100b having a composition ratio of 0<X<1 is buried. The composition of the $Si_{1-x}Ge_x$ layer 100b is the same as that of the layer $Si_{1-x}Ge_x$ 100a and is, e.g., $Si_{0.76}Ge_{0.24}$. Thus, in the PMOS transistor of the semiconductor device according to the present embodiment, the $Si_{1-x}Ge_x$ layer 100b is buried in the source/drain diffused layer 64p. Because of the lattice constant of the $Si_{1-x}Ge_x$ larger than that of Si, compression stress is applied to the channel region of the silicon substrate 34. According to the present embodiment, compression strain is applied to the channel region due to the presence of the $Si_{1-x}Ge_x$ layer 100b, whereby high hole mobility can be realized. Thus, according to the present embodiment, the operation speed of the PMOS transistor can be improved.

In the NMOS transistor 2, high carrier mobility is realized without intentionally applying crystal strain to the channel region. Accordingly, without intentionally burying a constituent member which applies crystal strain to the channel region in the source/drain diffused layer 64n, the NMOS transistor especially has no problem. It is also possible to apply tensile strain on the NMOS channel region by using a tensile-strained silicon nitride layer 74.

On the $Si_{1-x}Ge_x$ layer 100b buried in the recesses 104 in the source/drain diffused layer 64p, a nickel silicide film 102b of $NiSi_{1-x}Ge_x$ having a composition ratio X of 0<X<1. The composition ratio of the Ni to the $Si_{1-x}Ge_x$ of the $NiSi_{1-x}Ge_x$ forming the nickel silicide film 102 is 1:1. Specifically, the composition of the nickel silicide film 102b is the same as that of the nickel silicide film 102a and is, e.g., NiSi$_{0.76}$Ge$_{0.24}$. The film thickness of the nickel silicide film 102b is, e.g., 20 nm or below.

Thus, on the silicon substrate 34 in the PMOS transistor-to-be-formed region 98, a PMOS transistor 4 including the gate electrode 54p and the source/drain diffused layer 64p is formed.

A silicon nitride film 74 is formed on the silicon substrate 34 with the NMOS transistor 2 and the PMOS transistor 4 formed on. On the silicon nitride film 74, a silicon oxide film 76 is formed.

In the silicon oxide film 76 and the silicon nitride film 74, contact holes 78a are formed down to the nickel silicide films 72a, 102a on the gate electrodes 54n, 54p. In the silicon oxide film 76 and the silicon nitride film 74, contact holes 78b are formed down to the nickel silicide films 72b, 102b on the source/drain diffused layers 64n, 64p.

Contact plugs 84a, 84b of a barrier metal 80 and a tungsten film 82 are buried respectively in the contact holes 78a, 78b.

An inter-layer insulation film 86 is formed on the silicon oxide film 76 with the contact plugs 84, 84b buried in. In the inter-layer insulation film 86, an interconnection layer 106 is buried, electrically connected to the contact plugs 84a, 84b. The interconnection layer 106 is formed of a barrier metal 108 of a tantalum film, and a copper film 110.

An inter-layer insulation film 112 is formed on the inter-layer insulation film 86 with the interconnection layer 106 buried in. In the inter-layer insulation film 112, an interconnection layer 114 is buried, electrically connected to the interconnection layer 106. The interconnection layer 114 is formed of a barrier metal 116 of a tantalum film, and a copper film 118.

On the inter-layer insulation film 112 with the interconnection layer 114 buried in, electrodes 120 electrically connected to the interconnection layer 114 are formed. The electrodes 120 are formed of, e.g., an aluminum film.

Thus, the semiconductor device according to the present embodiment is constituted.

(The Method for Fabricating the Semiconductor Device)

Next, the method for fabricating the semiconductor device according to the present embodiment will be explained with reference to FIGS. 11A to 24. FIGS. 11A to 23C are sectional views of the semiconductor device in the steps of the method for fabricating the semiconductor device according to the present embodiment.

First, the surface of the silicon substrate 34 is cleaned with, e.g., ammonia-hydrogen peroxide mixture liquid. The silicon substrate 34 is, e.g., a p type (100) silicon substrate.

Figure 11A:
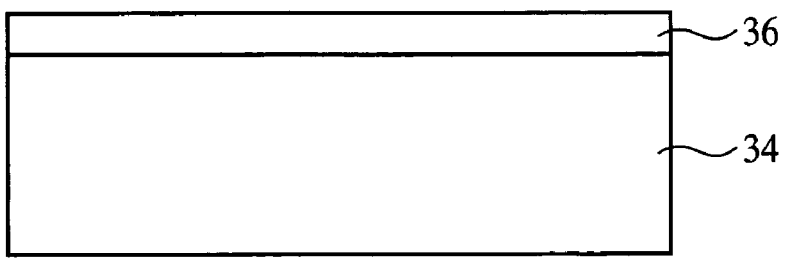
FIGS. 11A to 11C are sectional views of the semiconductor device according to a first embodiment of the present invention in the steps of the method for fabricating the semiconductor device, which illustrate the method (Part 1).
Figure 11B:
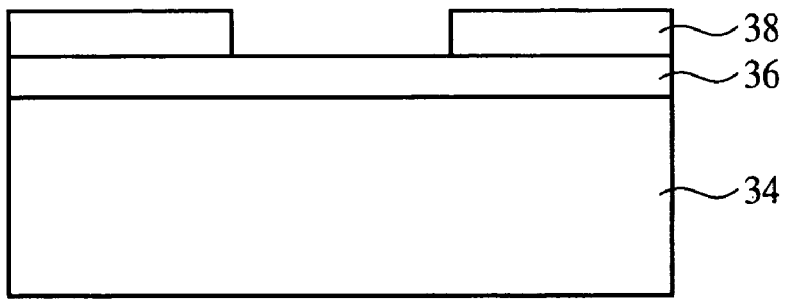

Next, a silicon oxide film 36 of, e.g., a 50 nm-thickness is formed on the silicon substrate 34 by, e.g., thermal oxidation (see FIG. 11A).

Then, a photoresist film 38 is formed by, e.g., spin coating. Then, the photoresist film 38 is patterned by photolithography. Thus, a photoresist mask 38 for patterning the silicon oxide film 36 is formed (see FIG. 11B).

Figure 11C:
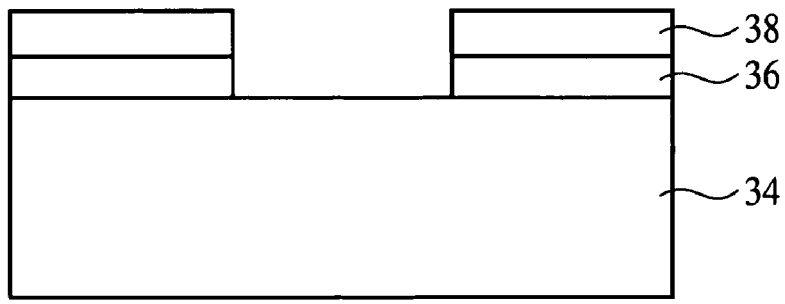

Next, with the photoresist film 38 as the mask, the silicon oxide film 36 is etched (see FIG. 11C).

Next, with the photoresist film 38 and the silicon oxide film 36 as the mask, a dopant impurity is implanted into the silicon substrate 34 by, e.g., ion implantation. Thus, a well 40 of a prescribed conduction type is formed (see FIG. 12A). When a p type well for forming an NMOS transistor is formed, boron, for example, is used as the p type dopant impurity, and conditions for the in implantation are, e.g., a 120 keV acceleration voltage and a $1\times10^{13}$ cm$^{-2}$ dose. When an n type well for forming a PMOS transistor is formed, phosphorus, for example, is used as the n type dopant impurity, and conditions for the ion implantation are, e.g., 300 ekV acceleration voltage and a $1\times10^{13}$ cm$^{-2}$ dose.

Figure 12A:
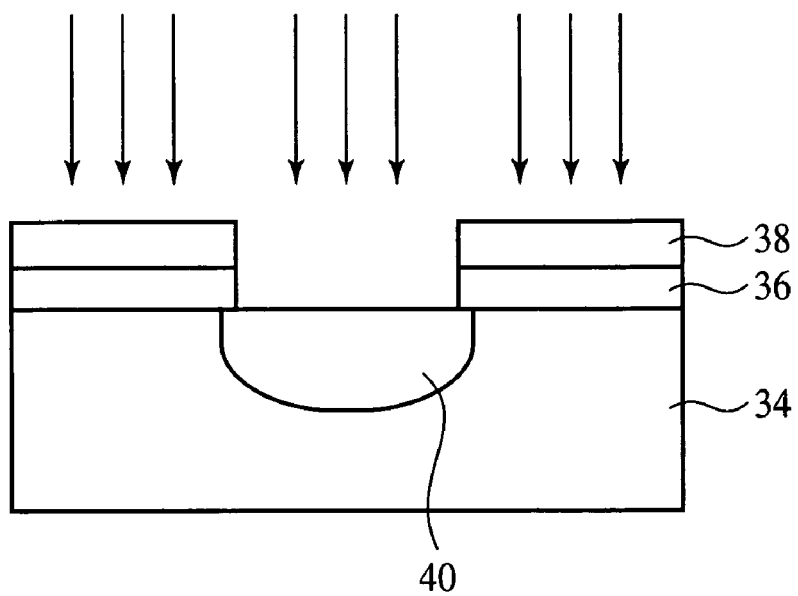
FIGS. 12A to 12C are sectional views of the semiconductor device according to the first embodiment of the present invention in the steps of the method for fabricating the semiconductor device, which illustrate the method (Part 2).
Figure 12B:
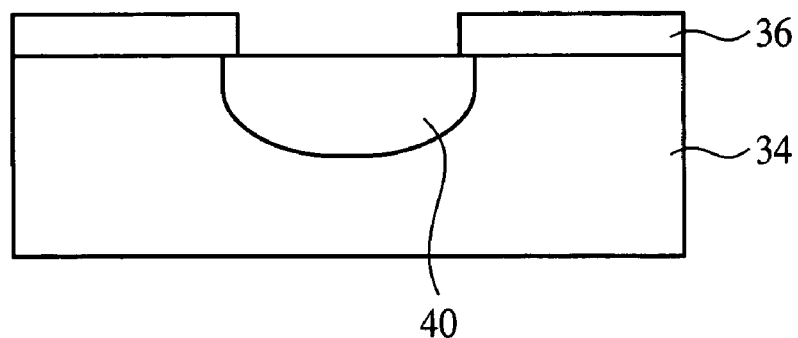

After the well 40 has been formed, the potoresist film 38 is released (see FIG. 12B).

Figure 12C:
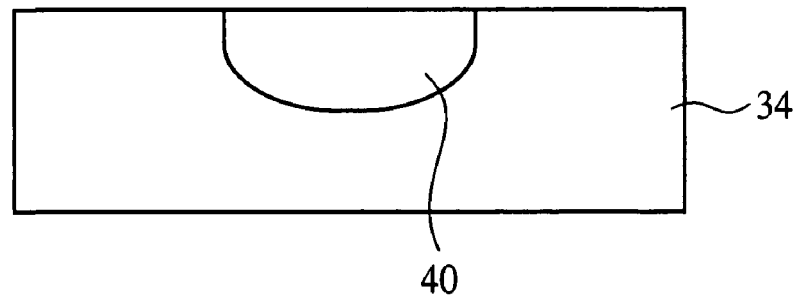

Then, the silicon oxide film 36 is etched off (see FIG. 12C).

Next, device isolation regions 46 for defining device regions are formed as follows by, e.g., STI (Shallow Trench Isolation).

Figure 13A:
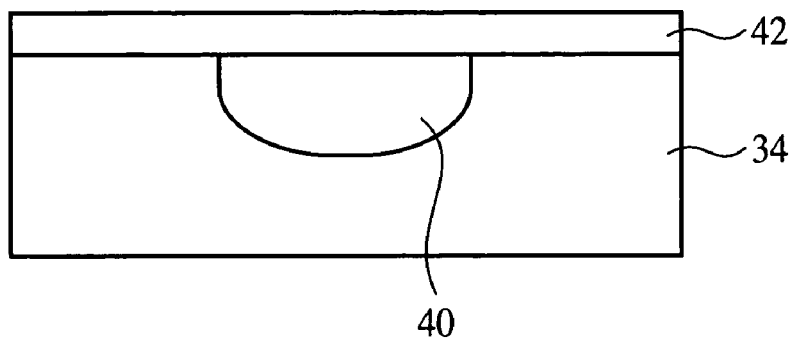
FIGS. 13A to 13C are sectional views of the semiconductor device according to the first embodiment of the present invention in the steps of the method for fabricating the semiconductor device, which illustrate the method (Part 3).
Figure 13B:
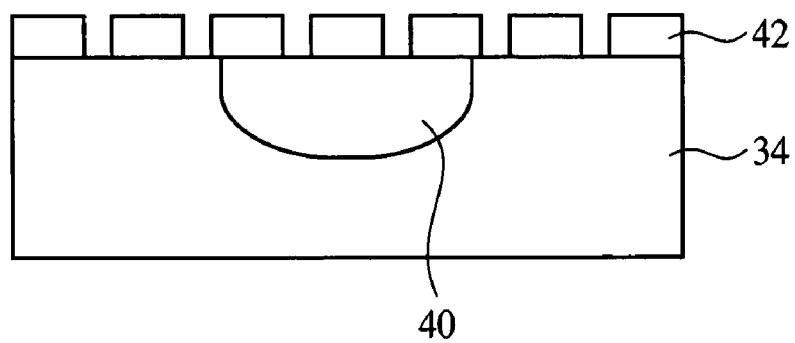
Figure 13C:
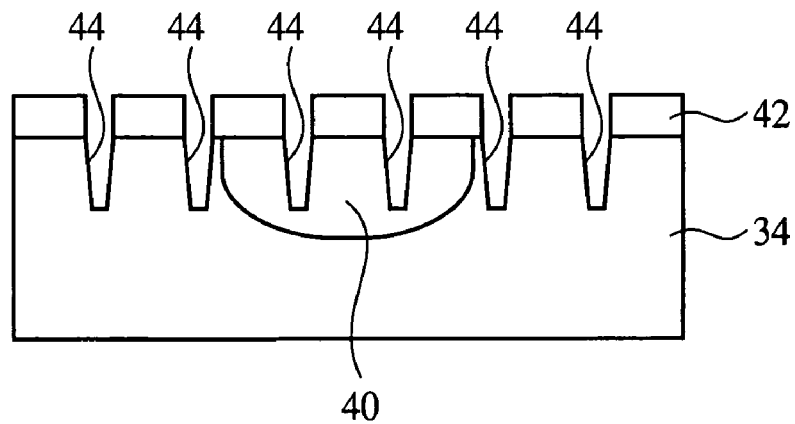

First, a silicon nitride film 42 of, e.g., a 50 nm-thickness is formed on the silicon substrate 34 by, e.g., CVD (Chemical Vapor Deposition) (see FIG. 13A).

Then, the silicon nitride film 42 is patterned by photolithography and dry etching. Thus, a hard mask 42 for forming the trench for a silicon oxide film to be buried in are formed (see FIG. 13B).

Next, with the silicon nitride film 42 as the mask, the silicon substrate 34 is etched. Thus the trenches 44 are formed in the silicon substrate 34 (see FIG. 13C).

Figure 14A:
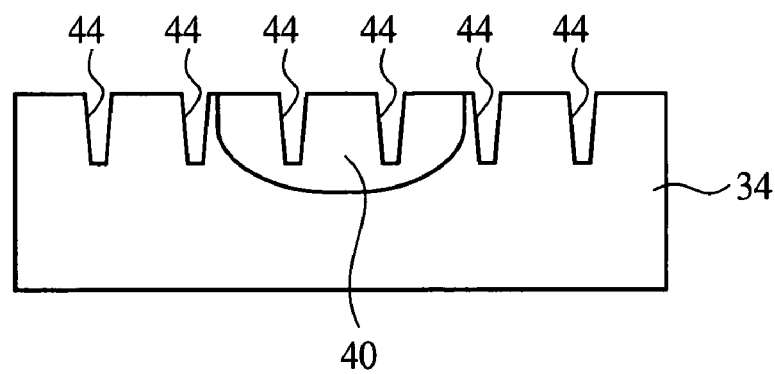
FIGS. 14A to 14C are sectional views of the semiconductor device according to the first embodiment of the present invention in the steps of the method for fabricating the semiconductor device, which illustrate the method (Part 4).

After the trenches 44 have been formed, a silicon nitride film 42 used the mask is removed by, e.g., wet etching (see FIG. 14A).

Then, a silicon oxide film of, e.g., a 300 nm-thickness is formed by, e.g., CVD on the silicon substrate 34 with the trenches 44 formed in.

Next, the silicon oxide film is polished until the surface of the silicon substrate 34 is exposed by, e.g., CMP (Chemical Mechanical Polishing) to remove the silicon oxide film on the silicon substrate 34.

Figure 14B:
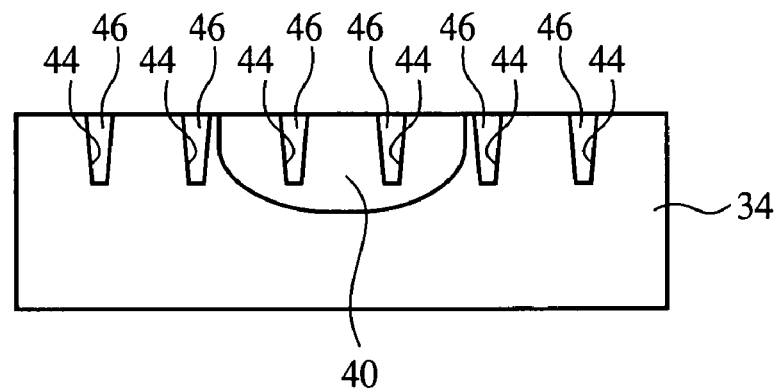

Thus, the device isolation regions 46 are formed of the silicon oxide film buried in the trenches 44 (see FIG. 14B). The device isolation regions 46 defined device regions.

Figure 14C:
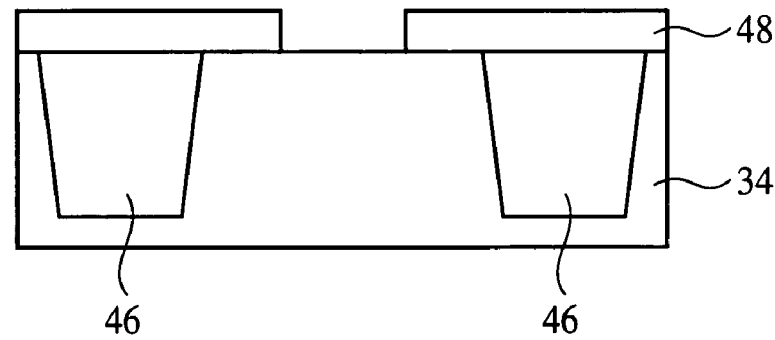

Then, a photoresist film 48 is formed by, e.g., spin coating. Then, the photoresist film 48 is patterned by photolithography. Thus, the photoresist mask 48 for forming the channel doped layer is formed (see FIG. 14C). In FIG. 14C and the followers, the device regions for the MOS transistors to be formed in are illustrated enlarged.

Next, with the photoresist film 48 as the mask, a dopant impurity is implanted in the silicon substrate 34 by, e.g., ion implantation. Thus, the channel doped layer 50 is formed in the silicon substrate 34 (see FIG. 15A). In forming the NMOS transistor, boron, for example, is used as the p type dopant impurity, and conditions for the ion implantation are, e.g., a 15 keV acceleration voltage and a $1\times10^{13}$ cm$^{-2}$ dose. In forming the PMOS transistor, arsenic, for example, is used as the n type dopant impurity, and conditions for the ion implantation are, e.g., a 80 keV acceleration voltage and a $1\times10^{13}$ cm$^{-2}$ dose.

After the channel doped layer 50 has been formed, the photoresist film 48 used as the mask is released.

Next, the dopant impurity in the channel doped layer 50 is activated by thermal processing of, e.g., 950° C. and 10 seconds.

Figure 15A:
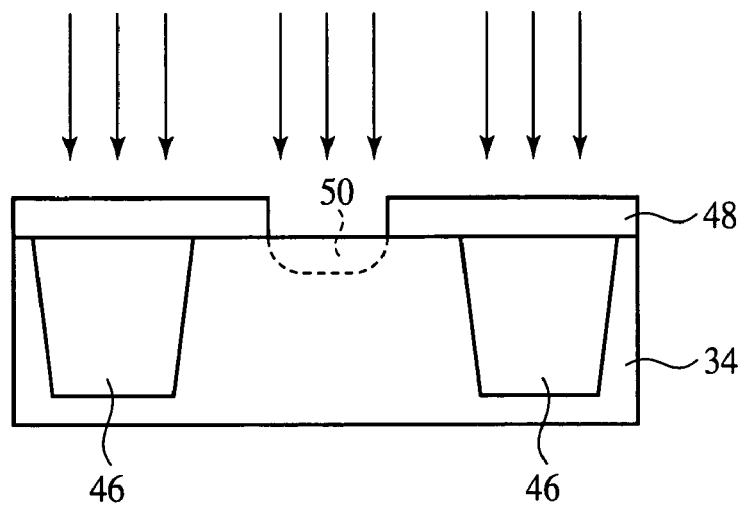
FIGS. 15A to 15C are sectional views of the semiconductor device according to the first embodiment of the present invention in the steps of the method for fabricating the semiconductor device, which illustrate the method (Part 5).
Figure 15B:
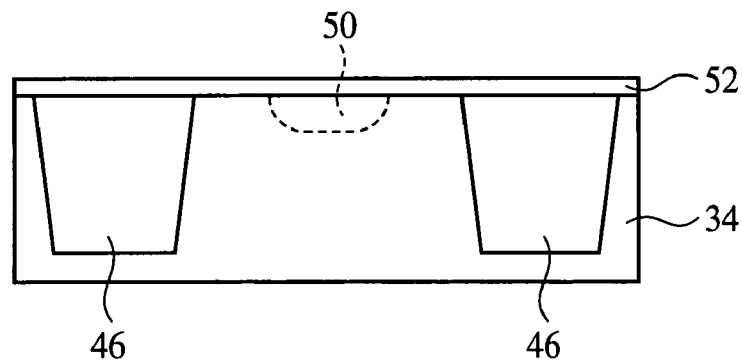

Next, the gate insulation film 52 of a silicon oxide film of, e.g., a 2 nm-thickness is formed on the silicon substrate 34 by, e.g., thermal oxidation (see FIG. 15B). The gate insulation film 52 is formed of silicon oxide film. However, the material of the gate insulation film 52 is not essentially silicon oxide film and can be suitably any other insulation film.

Next, the polysilicon film 54 of, e.g., a 100 nm-thickness is formed on the entire surface by, e.g., CVD.

Figure 15C:
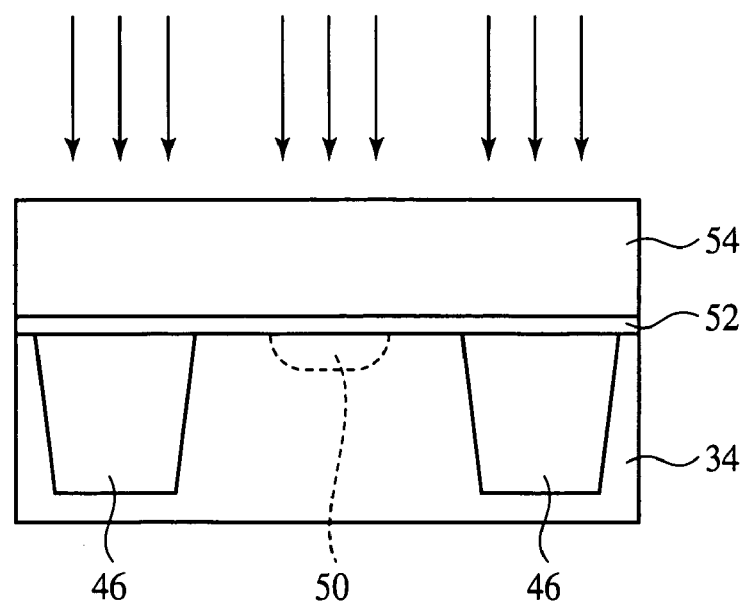
Figure 16A:
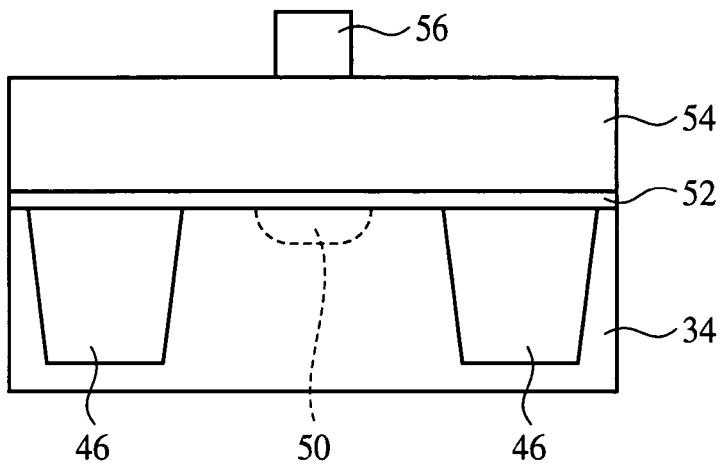
FIGS. 16A to 16C are sectional views of the semiconductor device according to the first embodiment of the present invention in the steps of the method for fabricating the semiconductor device, which illustrate the method (Part 6).
Figure 16B:
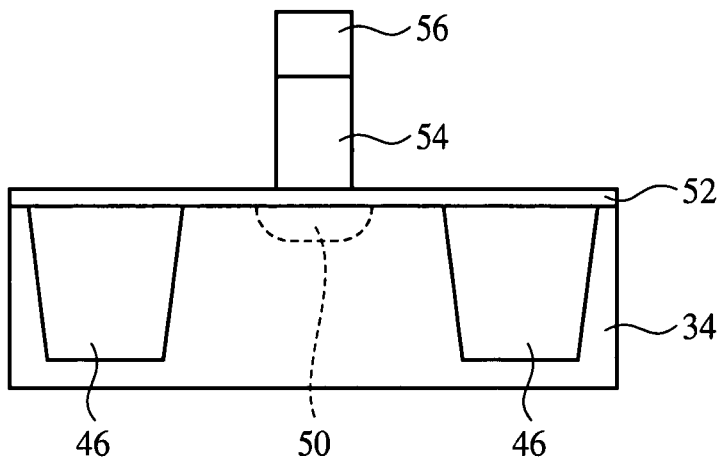
Figure 16C:
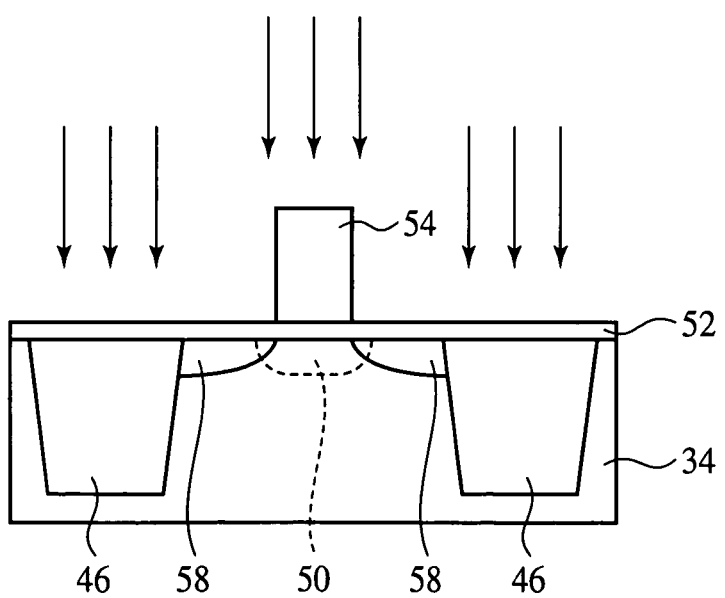

Next, a dopant impurity is implanted into the polysilicon film 54 by, e.g., ion implantation (see FIG. 15C). In forming the NMOS transistor, phosphorus, for example, is used as the n type dopant impurity, and conditions for the ion implantation are a 10 keV acceleration voltage and a $1\times10^{16}$ cm$^2$. In forming the PMOS transistor, boron, for example, is used as the p type dopant impurity, and conditions for the ion implantation for the ion implantation are, e.g., a 5 keV acceleration voltage and a $5\times10^{15}$ cm$^{-2}$ dose.

Next, a photoresist film 56 is formed by, e.g., spin coating. Then, the photoresist film 56 is patterned by photolithography. Thus, the photoresist mask 56 for patterning the polysilicon film 54 is formed (see FIG. 16A).

Next, with the photoresist film 56 as the mask, the polysilicon film 54 is dry etched. Thus, the gate electrode 54 of the polysilicon film is formed (see FIG. 16B).

After the gate electrode 54 has been formed, the photoresist film 56 used as the mask is removed.

Next, with the gate electrode 54 as the mask, a dopant impurity is implanted in the silicon substrate 34 on both sides of the gate electrode 54. In forming the NMOS transistor, arsenic, for example, is used as the n type dopant impurity, and conditions for implanting the ion implantation are, e.g., a 1 keV acceleration voltage and a $1\times10^{15}$ cm$^{-2}$ dose. In forming the PMOS transistor, boron, for example, is used as the p type dopant impurity, and conditions for the ion implantation are, e.g., a 0.5 keV acceleration voltage and a $1\times10^{15}$ cm$^{-2}$. Thus, the shallow impurity diffused regions 58 forming the extension regions of the extension source/drain structure are formed (see FIG. 16C).

Figure 17A:
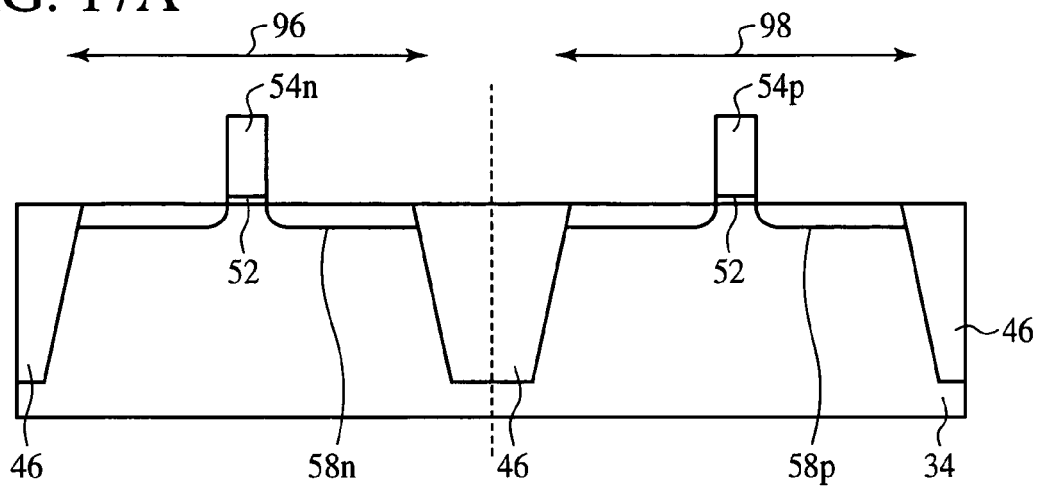
FIGS. 17A to 17C are sectional views of the semiconductor device according to the first embodiment of the present invention in the steps of the method for fabricating the semiconductor device, which illustrate the method (Part 7).
Figure 17B:
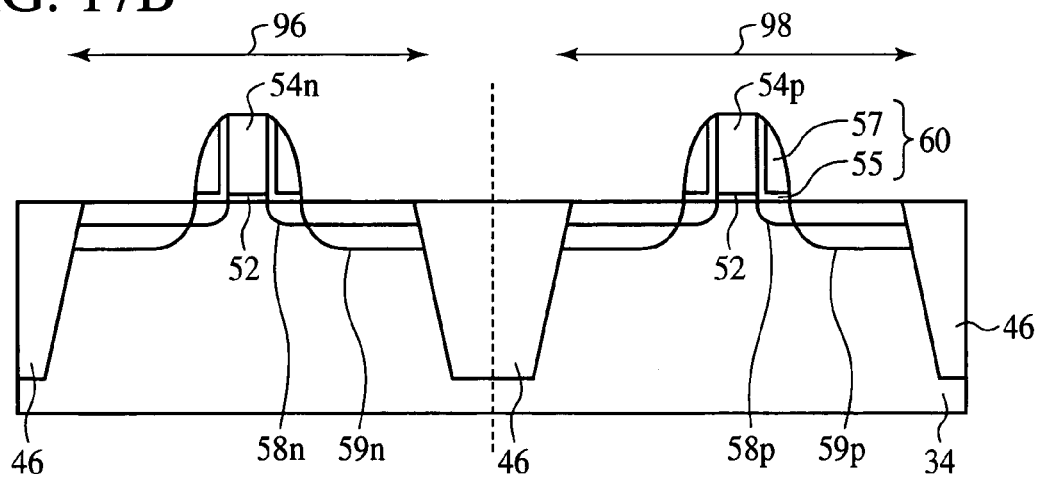

FIG. 17A illustrates the p type shallow impurity diffused layer 58p forming the extension region in the silicon substrate 34 on both sides of the gate electrode 54p, and the n type shallow impurity diffused layer 58n forming the extension region in the silicon substrate 34 on both sides of the gate electrode 54n.

Next, a silicon oxide film 55 of, e.g., a 10 nm-thickness is formed on the entire surface by, e.g., CVD.

Next, a silicon nitride film 57 of, e.g., a 80 nm-thickness is formed on the entire surface by, e.g., CVD.

Next, the silicon nitride film 57 and the silicon oxide film 55 are anisotropically etched, by RIE (Reactive Ion Etching). Thus, the sidewall insulation film 60 of the two-layer structure of the silicon oxide film 55 and the silicon nitride film 57 are formed on the side walls of the gate electrodes 54n, 54p (see FIG. 17B).

Next, with the gate electrodes 54n, 54p and the sidewall insulation film 60 as the mask, a dopant impurity is implanted into the silicon substrate 34 on both sides of the gate electrodes 54n, 54p and the sidewall insulation film 60 by, e.g., ion implantation. In forming the NMOS transistor, arsenic, for example, is used as the n type dopant impurity, and conditions for the ion implantation are, e.g., a 10 keV acceleration voltage and a $1\times10^{15}$ cm$^{-2}$ dose. In forming the PMOS transistor, boron, for example, is used as the p type dopant impurity, and conditions for the ion implantation are, e.g., a 2 keV acceleration voltage and a $1\times10^{15}$ cm$^{-2}$ dose. Thus, the impurity diffused regions 59n, 59p for making the extension regions 58, 58p less resistive are formed.

Next, a silicon oxide film 61 of, e.g., a 40 nm-thickness is formed on the entire surface by, e.g., CVD.

Then, the silicon oxide film 61 is anisotropically etched by, e.g., RIE. Thus, the sidewall insulation film 61 of the silicon oxide film is further formed on the side wall of the sidewall insulation film 60 (see FIG. 17C).

Figure 17C:
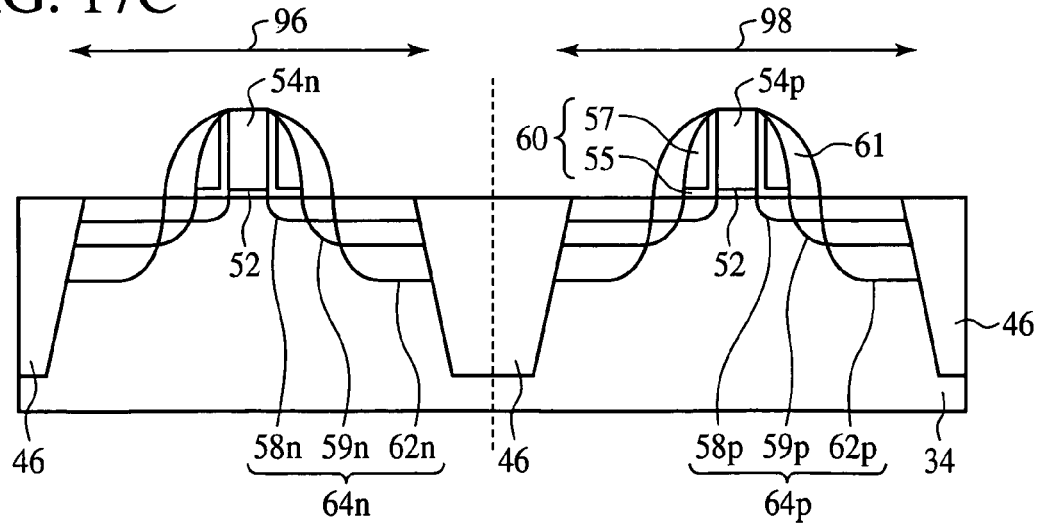

Then, with the gate electrode 54 and the sidewall insulation films 60, 61 as the mask, a dopant impurity is implanted into the silicon substrate 34 on both sides of the gate electrode 54 and the sidewall insulation films 60, 61 by, e.g., ion implantation. In forming the NMOS transistor, phosphorus, for example, is used as the n type dopant impurity, and conditions for the ion implantation are an 8 keV acceleration voltage and a $1\times10^{16}$ cm$^{-2}$ dose. In forming the PMOS transistor, boron, for example, is used as the p type dopant impurity, and conditions for the ion implantation are, e.g., a 5 keV acceleration energy and a $5\times10^{15}$ cm$^{-2}$. Thus, the impurity diffused regions 62n, 62p for forming the deep regions of the source/drain diffused layer are formed (FIG. 17C).

Then, prescribed thermal processing is made to activate the dopant impurities introduced into the impurity diffused regions 58n, 58p, 59n, 59p, 62n, 62p.

Thus, the source/drain diffused layer 64n, 64p including the extension regions, i.e., the shallow impurity diffused regions 58n, 58p, the impurity diffused regions 59n, 59p for making the extension regions 58n, 58p less resistive, and the deep impurity diffused regions 62n, 62p are formed in the silicon substrate 34 on both sides of the gate electrodes 54.

Figure 18A:
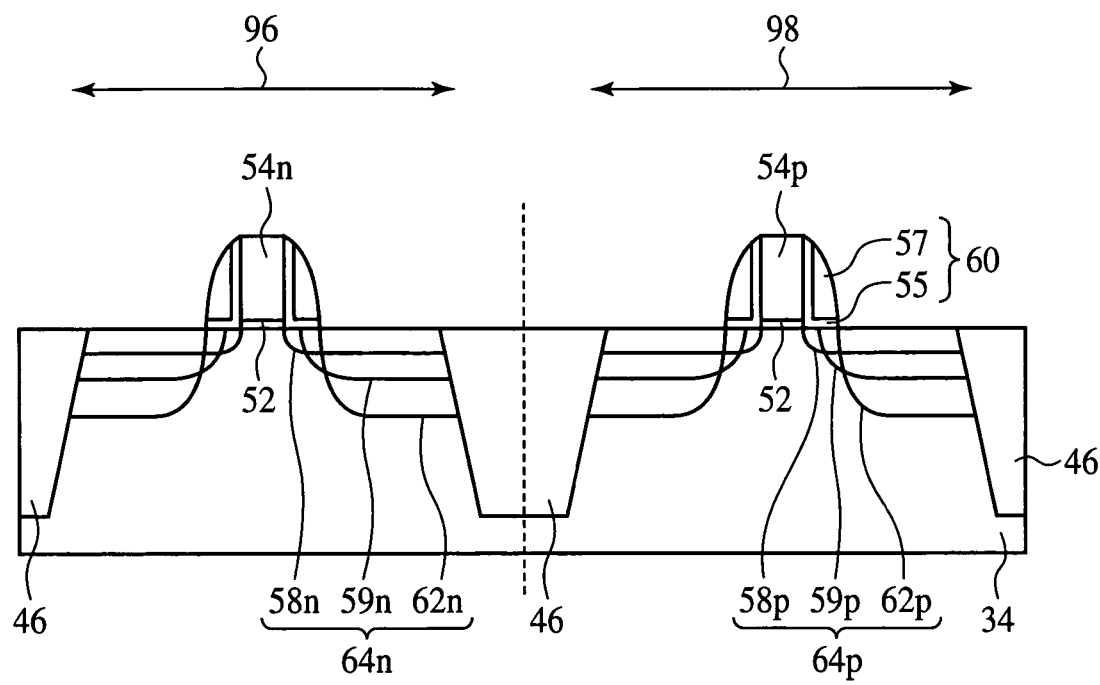
FIGS. 18A and 18B are sectional views of the semiconductor device according to the first embodiment of the present invention in the steps of the method for fabricating the semiconductor device, which illustrate the method (Part 8).
Figure 18B:
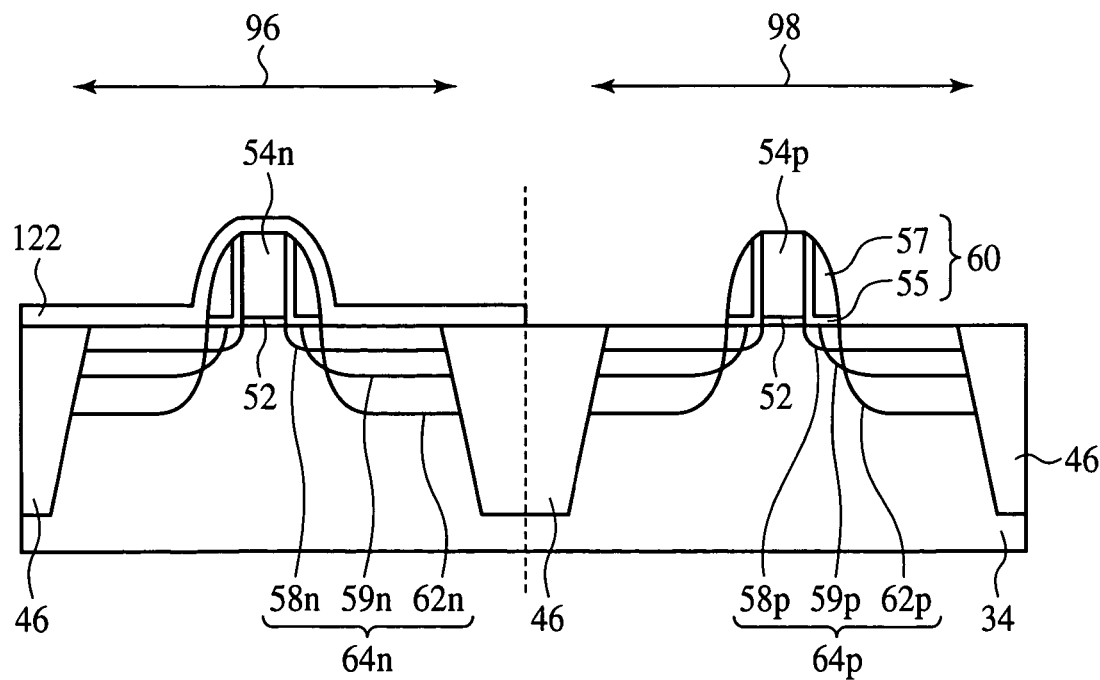
Figure 19A:
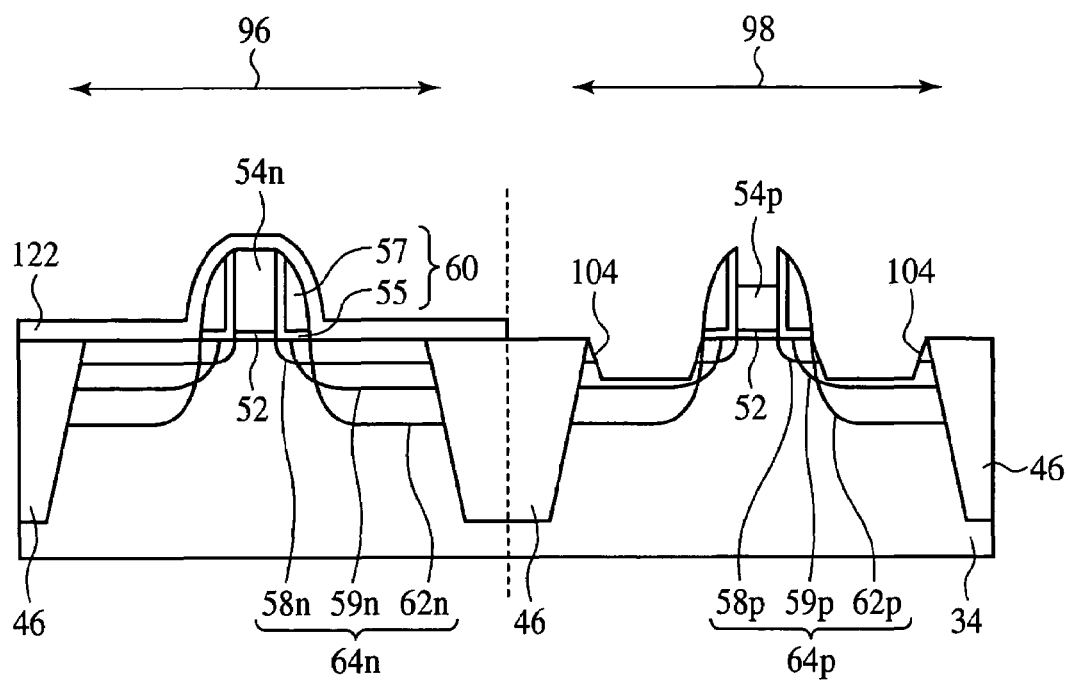
FIGS. 19A and 19B are sectional views of the semiconductor device according to the first embodiment of the present invention in the steps of the method for fabricating the semiconductor device, which illustrate the method (Part 9).
Figure 19B:
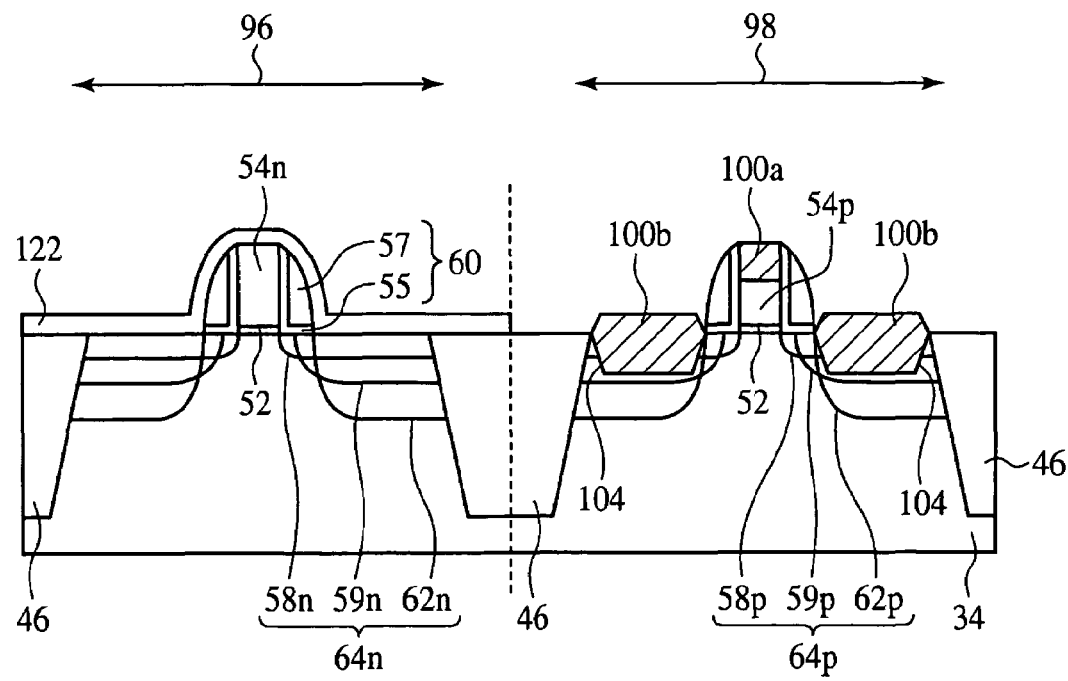

Then, the sidewall insulation film 61 formed on the outside of the sidewall insulation film 60 is etched off (see FIG. 18A).

Next, a silicon oxide film 122 of, e.g., a 40 nm-thickness is formed on the entire surface by, e.g., CVD.

Next, the silicon oxide film 122 is patterned by photolithography and dry etching. Thus, the silicon oxide film 122 on the PMOS transistor-to-be-formed region 98 and on the device isolation region 46 defining the PMOS transistor-to-be-formed region 98 is removed while the silicon oxide film 122 on the NMOS transistor-to-be-formed region 96 and on the device isolation region 46 defining the NMOS transistor-to-be-formed region 96 is selectively left (see FIG. 18B).

Next, with the silicon oxide film 122 as the mask, the silicon substrate 34 is etched with high selectivity with respect to the silicon oxide film. Thus, a 50 nm-depth recess 104 is formed in the source/drain diffused layer 64p on both sides of the gate electrode 54p and the sidewall insulation film 60. At this time, an upper part of the gate electrode 54p of polysilicon film is also removed (see FIG. 19A).

Then, the surface of the silicon substrate 34 with the recess 104, etc. formed in is cleaned for, e.g., 5 seconds with dilute hydrofluoric acid (e.g., HF:$H_2O$=5:100). Then, with the silicon oxide film 122 as the mask, a silicon germanium layer ($Si_{1-x}Ge_x$ layer) 100a, 100b with a dopant impurity doped is grown by, e.g., CVD selectively on the gate electrode 54p and in the recess 104 (see FIG. 19B). The dopant impurity is, e.g., boron. The composition of the $Si_{1-x}Ge_x$ layer 100a, 100b is, e.g., $Si_{0.76}Ge_{0.24}$. Conditions for forming the $Si_{1-x}Ge_x$ layer 100a, 100b are, e.g., a $GeH_4$, $SiH_4$ and $B_2H_6$ mixed gas as the raw material gas, a 0.3 Pa $GeH_4$ partial pressure, a 6 Pa $SiH_4$ partial pressure, a 0.00001 Pa $B_2H_6$ partial pressure, and a 550° C. film forming temperature. The film thickness of the $Si_{1-x}Ge_x$ layer 100a, 100b is, e.g., 60 nm.

The composition ratio of the Ge of the $Si_{1-x}Ge_x$ layer may not be essentially 0.24. The composition ratio X of the Ge is suitably set in the range of $0<X\leq0.3$.

Thus, in the PMOS transistor-to-be-formed region 98, the silicon germanium layer 100b is buried in recess 104 of the source/drain diffused layer 64. The gate electrode 54p is formed of the silicon germanium layer 100a on the polysilicon film.

Next, ions are implanted in an upper part of the silicon germanium layer by ion implantation. The ions to be implanted are, e.g., Ge ions. Thus, the upper part of the silicon germanium layer 100a, 100b is made amorphous, and the amorphous layer 101 is formed on the upper part of the silicon germanium layer 100a, 100b (see FIG. 20A). The thickness of the amorphous layer 101 is 20 nm or below. More specifically, the thickness of the amorphous layer is about 10-20 nm.

The thickness of the amorphous layer 101 is 20 nm or below for the following reason. The amorphous layer 101 is silicided in a step which will be described later. However, when the upper part alone of the amorphous layer 101 is silicided, and the amorphous layer 101 is present between the silicon germanium layer 100a, 100b and the nickel silicide film 102a, 102b, the electric resistance cannot be sufficiently low between the nickel silicide film 102a, 102b and the silicon germanium layer 10a. 100b. Accordingly, all the amorphous layer 101 must be silicided so that the amorphous layer 101 does not remain between the silicon germanium layer 100a, 100b and the nickel silicide film 102a, 102b. When the amorphous layer 101 is formed relatively thick, and such thick amorphous layer 20 is silicided, the distance between the junctions of the source/drain diffused layer 64p and the silicide layer 102b is too short, which increase the leak current. To fabricate a micronized semiconductor device having the junctions of the source/drain diffused layer 64b formed shallow, the film thickness of the nickel silicide film must be sufficiently small. To make the film thickness of the nickel silicide film 102b sufficiently small, the thickness of the amorphous layer 101 to be slicided must be sufficiently small. In view of this, the thickness of the amorphous layer 101 is 20 nm or below.

To make the amorphous layer 101 in the thickness of 20 nm or below, conditions for the ion implantation are, e.g., a 10 keV acceleration voltage, and a dose which makes the upper part of the silicon germanium layer 100a, 100b amorphous, e.g., $1 \times 10^{14}$-$1 \times 10^{15}$ cm$^{-2}$.

Ge ions are implanted into the upper part of the silicon germanium layer 100a, 100b here, but ions to be implanted are not limited to Ge ions. For example, Ar ions, Si ions, As ions, Sb ions, N ions, Xe ions, Kr ions, or other may be implanted. Conditions for the ion implantation for Ar ions are, e.g., a 5-15 keV acceleration energy and a $1 \times 10^{14}$-$1 \times 10^{15}$ cm$^{-2}$ dose. Conditions for the ion implantation for Si ions are, e.g., a 3-5 keV acceleration energy and a $1 \times 10^{14}$-$1 \times 10^{15}$ cm$^{-2}$ dose. Conditions for the ion implantation for As ions are, e.g., a 5-15 keV acceleration energy and a $1 \times 10^{14}$-$1 \times 10^{15}$ cm$^{-2}$ dose. Conditions for the ion implantation for Sb ions are, e.g., a 5-10 keV acceleration energy and a $1 \times 10^{14}$-$1 \times 10^{15}$ cm$^{-2}$ dose. Conditions for the ion implantation for N ions are, e.g., a 3-5 keV acceleration energy and a $1 \times 10^{14}$-$1 \times 10^{15}$ cm$^{-2}$ dose. Conditions for the ion implantation for Xe ions are, e.g., a 10-20 keV acceleration energy and a $1 \times 10^{14}$-$1 \times 10^{15}$ cm$^{-2}$ dose. Conditions for the ion implantation for Kr ions are, e.g., a 5-20 keV acceleration energy and a $1 \times 10^{14}$-$1 \times 10^{15}$ cm$^{-2}$ dose.

Then, the silicon oxide film 122 formed in the NMOS transistor-to-be-formed region 96 is etched off.

Then, natural oxide film formed on the surface of the gate electrode 54n, the surface of the source/drain diffused layer 64n, the surface of the silicon germanium layer 100a of the gate electrode 54p, the surface of the silicon germanium layer 100b buried in the recess 104 of the source/drain diffused layer 64p is removed by, e.g., hydrofluoric acid processing.

The silicon oxide film 122 is etched off here before the natural oxide film is removed by the hydrofluoric acid processing. However, the silicon oxide film 122, which has been damaged by the ion implantation for making the upper part of the silicon germanium layer 100a, 100b amorphous, can be removed only by the hydrofluoric acid processing without exclusively performing the step of etching the silicon oxide film 122.

Figure 20A:
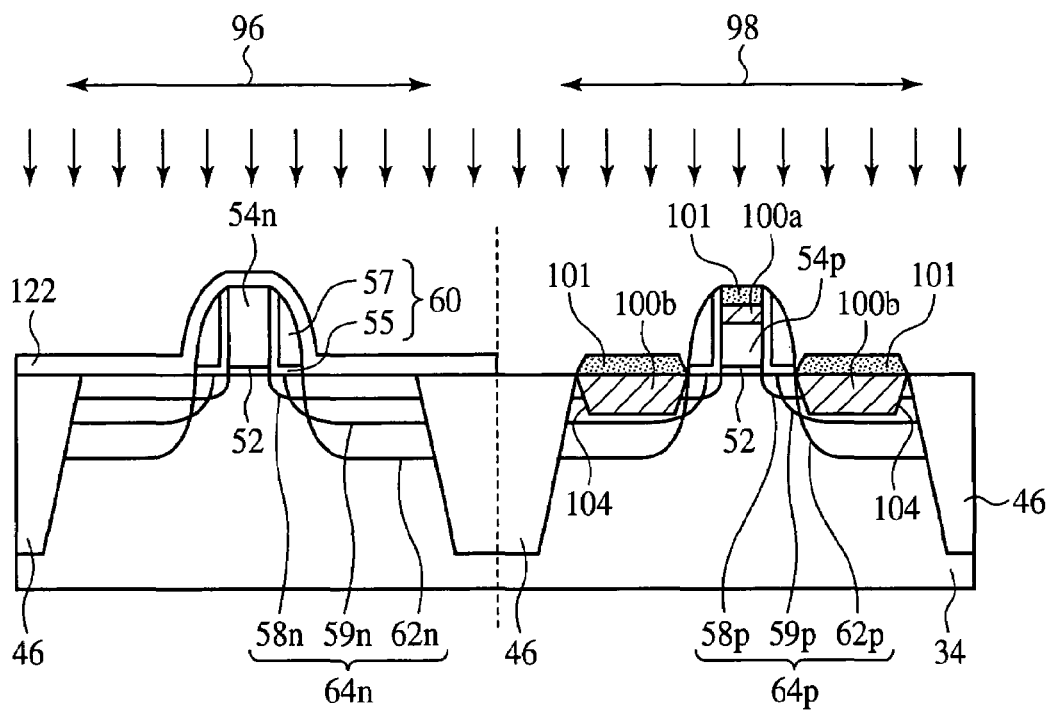
FIGS. 20A and 20B are sectional views of the semiconductor device according to the first embodiment of the present invention in the steps of the method for fabricating the semiconductor device, which illustrate the method (Part 10).
Figure 20B:
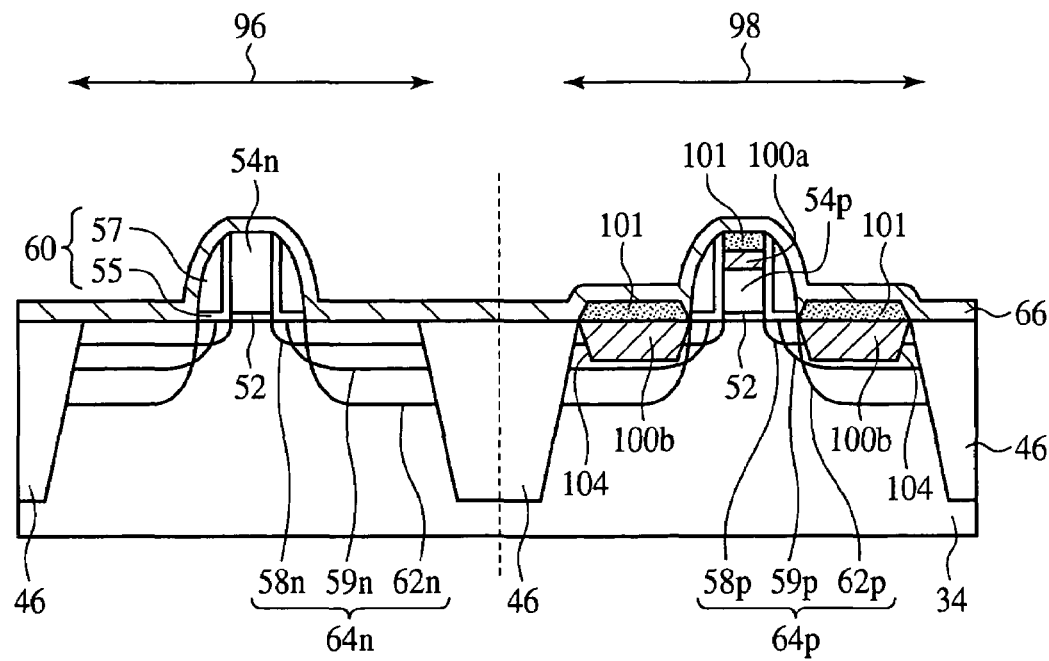

Next, a nickel film 66 of, e.g., a 10-12 nm-thickness is formed on the entire surface by sputtering using, e.g., an Ni target (see FIG. 20B). As described above, because all the amorphous payer 101 on the silicon germanium layer 100a, 100b must be silicided, the thickness of the nickel film 66 must be set at a thickness required to silicide all the amorphous layer 101 on the silicon germanium layer 100a, 100b. The thickness of the nickel film 66 may be suitably set in accordance with the thickness of the amorphous layer 101.

However, when the silicidation is performed in a later step, the unreacted part of the nickel film 66 must be removed without failure. Preferably, the thickness of the nickel film 66 is set at 12 nm or below so that the unreacted part of the nickel film 66 can be removed without failure.

Figure 21A:
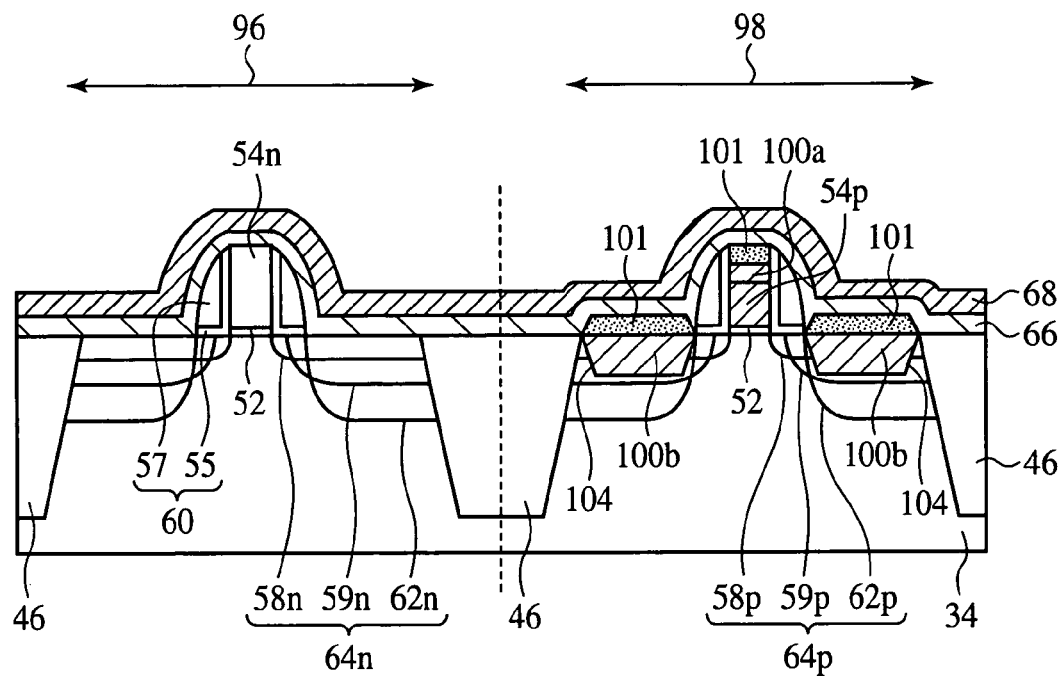
FIGS. 21A and 21B are sectional views of the semiconductor device according to the first embodiment of the present invention in the steps of the method for fabricating the semiconductor device, which illustrate the method (Part 11).
Figure 21B:
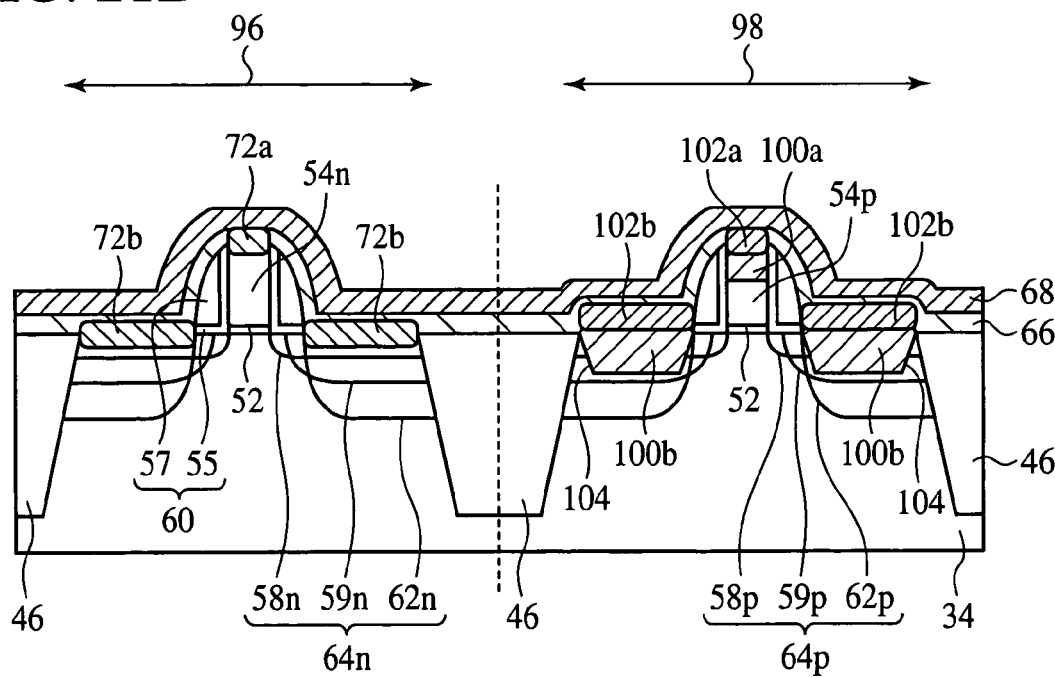

Then, a protection film 68 of, e.g., 10 nm-thickness TiN film on the nickel film 66 by, e.g., sputtering (see FIG. 21A). The protection film 68 is not essentially TiN film. The protection film may be, e.g., a 5-30 nm-thickness Ti film.

Next, thermal processing for siliciding the amorphous layer 101 is made by, e.g., RTA. Conditions for the thermal processing are, e.g., 430° C. and 30 seconds. The silicidation gradually advances and is stopped when the silicidation of the amorphous layer 101 is completed, i.e., the undersurface of the silicide layer 102a, 102b arrives at the upper surface of the silicon germanium layer 100a, 100b. As described above with reference to FIGS. 6A to 6E, at the early stage of the thermal processing, nickel silicide film of Ni$_2$(Si$_{1-x}$Ge$_x$) phase is formed, and finally nickel silicide film of Ni(Si$_{1-x}$Ge$_x$) phase is formed. The nickel silicide film 102b of Ni$_2$(Si$_{1-x}$Ge$_x$) phase is formed at the early stage of the thermal processing, because the supply amount of the Ni is large with respect to the supply amounts of the Si and Ge. Thus, the nickel silcide film 102a, 102b is formed on the silicon germanium layer 100a, 100b (see FIG. 21B).

It is important that, as described above, the thermal processing for the silicidation is stopped when the silicidation of the amorphous layer 102a, 102b on the silicon germanium layer 100a, 100b is completed, i.e., when the undersurface of the silcide layer 102a, 102b arrives at the upper surface of the silicon germanium layer 100a, 100b. When the thermal processing is not stopped when the silicidation of the amorphous layer 101 on the silicon germanium layer 100a, 100b is completed, and reaction is set on, the silicon germanium layer 100a, 100b even in the part which has not been made amorphous goes on being silicided, and the Ni(Si$_{1-x}$Ge$_x$)$_2$ crystals will be formed in spikes along the (111) faces of the crystals forming the silicon germanium layer 100a. 100b.

However, the thermal processing may not be stopped immediately when the undersurface of the silicide layer 102a, 102b arrives at the upper surface of the silicon germanium layer 100a, 100b, because when the thickness of the silicon germanium layer 100a, 100b to be silicided is small, the Ni(Si$_{1-x}$Ge$_x$)$_2$ crystals are not formed in spikes along the (111) faces of the crystals forming the silicon germanium layer 100a. 100b.

The composition ratio of the Ni to the Si$_{1-x}$Ge$_x$ of the NiSi$_{1-x}$Ge$_x$ of the nickel silcide film 101a, 101b is 1:1. The composition of the nickel silcide film 101a, 101b is, e.g., NiSi$_{0.76}$Ge$_{0.24}$.

Figure 22:
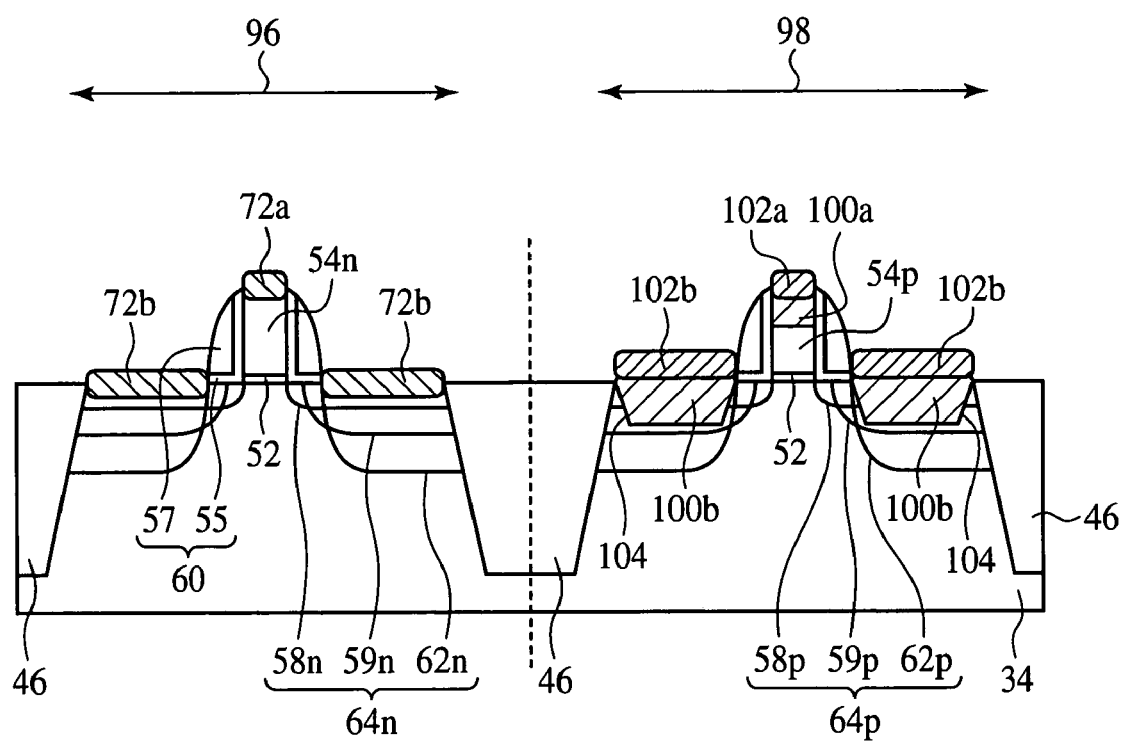
FIG. 22 is sectional views of the semiconductor device according to the first embodiment of the present invention in the steps of the method for fabricating the semiconductor device, which illustrate the method (Part 13).

Next, the parts of the protection film 68 and the Ni film 66, which have not reacted with the Si or Si$_{1-x}$Ge$_x$ are respectively removed selectively by wet etching (see FIG. 22). As the etching solution, for example, SPM liquid which is a mixture of sulfuric acid and hydrogen peroxide, is used. The mixing ratio of the sulfuric acid and the hydrogen peroxide is, e.g., 3:1. The etching period of time is, e.g., 20 minutes. In place of SPM liquid, HPM liquid, which is a chemical liquid mixing hydrochloric acid, hydrogen peroxide and water, may be used.

Thus, the nickel silicide film 102a, 102b of the NiSi$_{1-x}$Ge$_x$ is formed on the Si$_{1-x}$Ge$_x$ layer (silicon germanium layer)

100a and the $Si_{1-x}Ge_x$ layer (silicon germanium layer) 100b. The composition ratio of the nickel silicide film 102a, 102b is, e.g., $NiSi_{0.76}Ge_{0.24}$.

Thus, by the SALICIDE process, the NiSi film 72a and NiSi film 72b is formed respectively on the gate electrode 54n and on the source/drain diffused layer 64n for the NMOS transistor 2. The film thickness of the Ni film 66 and conditions for the thermal processing are suitably set, whereby to form the NiSi film 72a, 72b in a required film thickness. The NiSi film 72a, 72b of, e.g., an about 20 nm-thickness can be formed.

By the SALICIDE process, the $NiSi_{1-x}Ge_x$ layer 102a and $NiSi_{1-x}Ge_x$ layer 102b is formed respectively on the $Si_{1-x}Ge_x$ layer 100a of the gate electrode 54p and on the $Si_{1-x}Ge_x$ layer 100b buried in the recess 104 of the source/drain diffused layer 64p for the PMOS transistor 4. The film thickness of the nickel film 66, conditions for the thermal processing, etc. are suitably set, whereby the $NiSi_{1-x}Ge_x$ layer 102a, 102b can be formed in a required film thickness. The $NiSi_{1-x}Ge_x$ layer 102a, 102b of a thickness of 20 nm or below can be formed.

Next, a silicon nitride film 74 of, e.g., a 50 nm-thickness is formed on the entire surface by, e.g., plasma CVD. The film forming temperature of the silicon nitride film 74 is, e.g., 400° C. The steps following the SALICIDE process are performed at a temperature 500° C. or below so as to suppress the agglomeration of the NiSi film 72a, 72b.

The steps following the SALICIDE process are performed at a temperature 500° C. or below, based on the following evaluation result.

Figure 24:
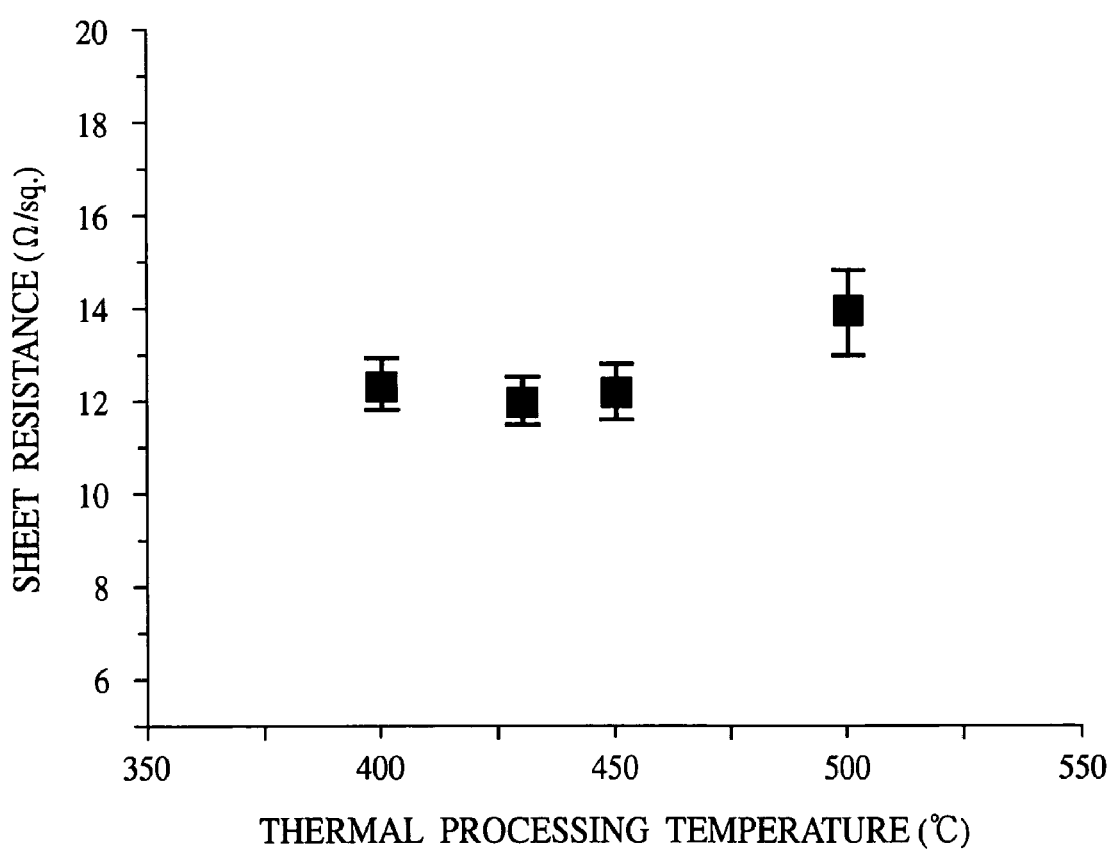
FIG. 24 is a graph of relationships between the thermal processing temperature and the sheet resistance.
Figure 25A:
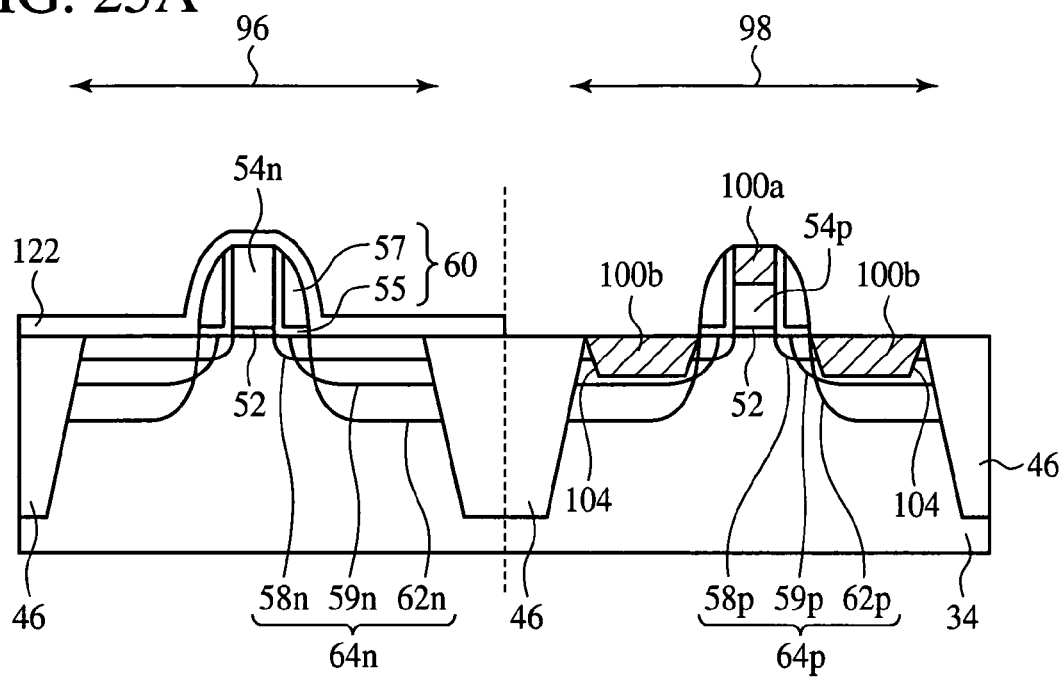
FIGS. 25A and 25B are sectional views of the semiconductor device according to a second embodiment of the present invention in the steps of the method for fabricating the semiconductor device, which illustrate the method (Part 1).
Figure 25B:
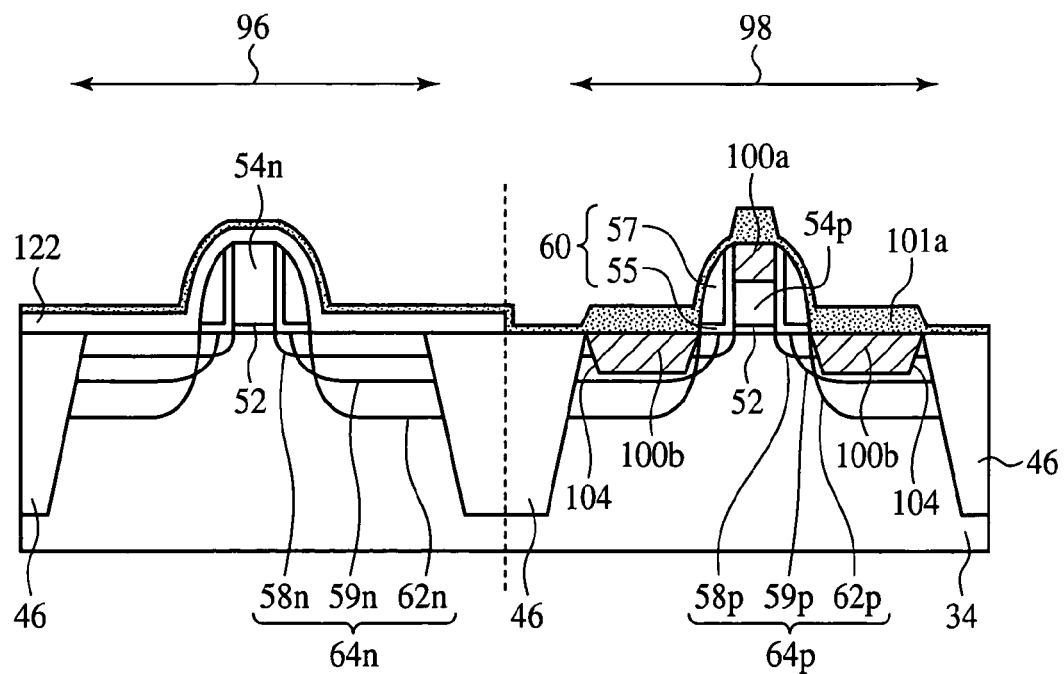

FIG. 24 is a graph of relationships between the thermal processing temperature and the sheet resistance. The thermal processing temperature is, taken on the horizontal axis, and on the vertical axis the sheet resistance is taken. The processing for preparing the samples was as follows. First, an $Si_{1-x}Ge_x$ layer of the Ge composition ratio X of 0.24 was epitaxially grown on a silicon substrate. Then, Ge ions were implanted into the surface of the $Si_{1-x}Ge_x$ layer to make the surface of the $Si_{1-x}Ge_x$ layer amorphous, and an amorphous layer was formed on the $Si_{1-x}Ge_x$ layer. Next, a nickel film and a TiN film were sequentially formed on the amorphous layer. Then, thermal processing for the silicidation was formed. Next, the unreacted Ni film was etched off with SPM liquid. The sheet resistance was measured on the thus prepared samples. The result shown in FIG. 24 was obtained.

As seen in FIG. 24, the sheet resistance for the thermal processing temperature 500° C. is increased in comparison with the sheet resistances for the thermal processing temperatures of below 500° C. The sheet resistance increase is due to the agglomeration in the nickel silicide film. Based on this, to prevent the sheet resistance increase due to the agglomeration in the nickel silicide film, preferably the steps following the SALICIDE process are performed at a temperature of 500° C. or below.

Next, a silicon oxide film 76 of, e.g., a 600 nm-thickness is formed on the silicon nitride film 74 by, e.g., plasma CVD. The film forming temperature for forming the silicon nitride film is, e.g., 400° C.

Next, the silicon oxide film 76 is planarized by, e.g., CMP.

Then, by photolithography and dry etching, in the silicon oxide film 76 and the silicon nitride film 74, the contact holes 78a and contact holes 78b are formed respectively down to the NiSi film 72a and down to the NiSi film 72b.

Next, the surface of the silicon oxide film 76 and the insides of the contact holes 78a, 78b are cleaned by reverse sputtering with argon. Then, without the exposure to the atmosphere, the barrier metal 80 of a titanium film of, e.g., a 10 nm-thickness and a titanium nitride film of, e.g., a 50 nm-thickness is formed by sputtering on the silicon oxide film 76 with the contact holes 78a, 78b formed in.

Next, on the barrier metal 80, the tungsten film 82 of, e.g., a 300 nm-thickness is formed by, e.g., CVD. Then, the tungsten film 82 and the barrier metal 80 are polished by, e.g., CMP until the surface of the silicon oxide film 76 is exposed. Thus, the contact plugs 84a, 84b of the barrier metal 80 and the tungsten film 82 are formed respectively in the contact holes 78a, 78b.

Next, the inter-layer insulation film 86 is formed on the entire surface by, e.g., CVD.

Next, trenches for burying the interconnection layer 106 in the inter-layer insulation film 86 are formed by photolithography.

Next, the barrier metal 108 of a tantalum film is formed by, e.g., sputtering.

Next, a seed film (not illustrated) of copper is formed by, e.g., sputtering.

Next, the copper film 110 is formed by, e.g., electroplating.

Then, the copper film 110 and the barrier metal film 108 are polished by, e.g., CMP until the surface of the inter-layer insulation film 86 is exposed. Thus, the interconnection layer 106 of the barrier metal film 108 and the copper film 110 is formed.

Next, the inter-layer insulation film 112 is formed on the entire surface by, e.g., CVD.

Next, trenches for burying the interconnection layer 112 in the inter-layer insulation film 86 are formed by photolithography.

Next, a barrier metal 116 of a tantalum film is formed by, e.g., sputtering.

Next, a seed film (not illustrated) of copper is formed by, e.g., sputtering.

Next, the copper film 118 is formed by, e.g., electroplating.

Then, the copper film 118 and the barrier metal film 116 are polished by, e.g., CMP until the surface of the inter-layer insulation film 112 is exposed. Thus, the interconnection layer 114 of the barrier metal film 116 and the copper film 118 is formed.

Next, an aluminum film is formed by, e.g., sputtering.

Next, the aluminum film is patterned by photolithography. Thus, electrodes 120 of the aluminum film are formed.

Figure 23:
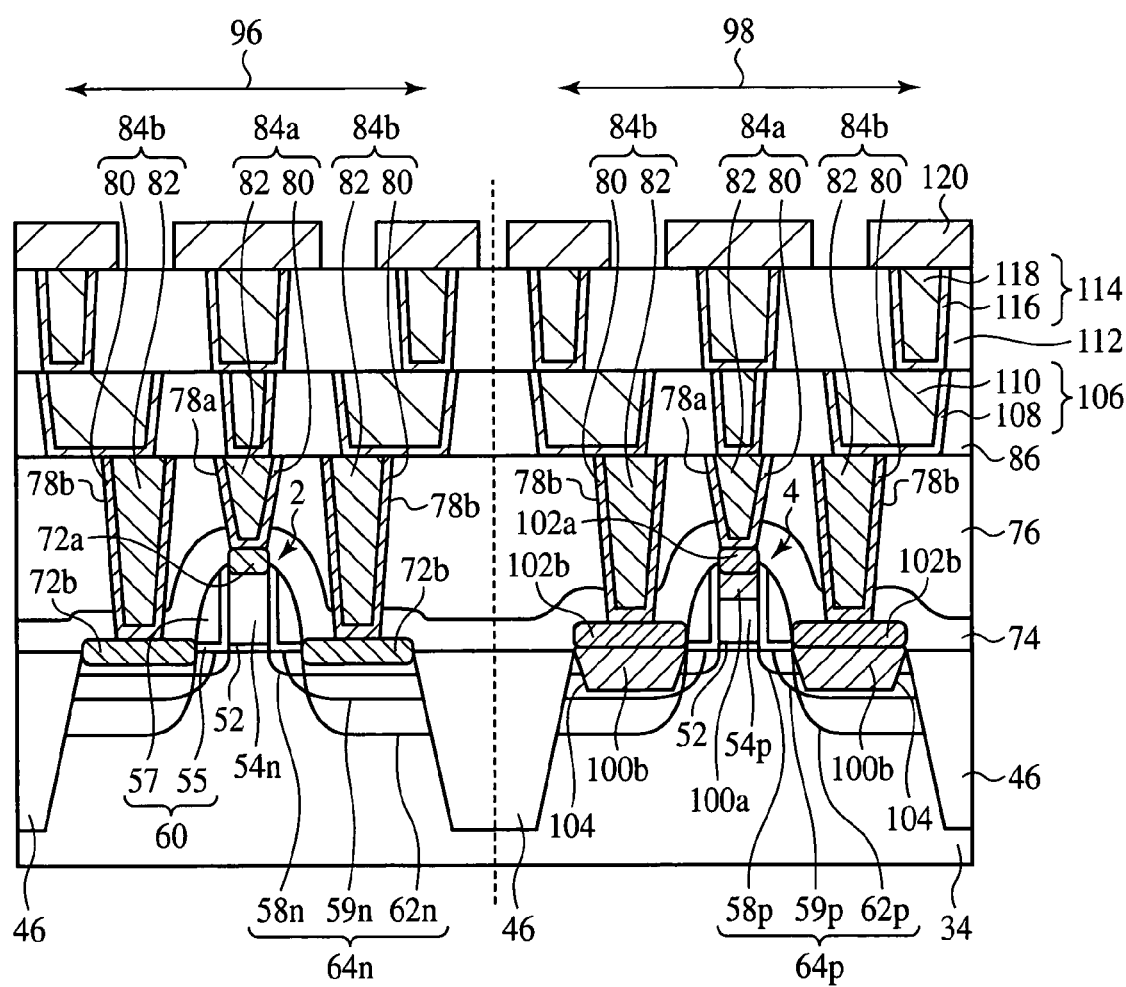
FIG. 23 is sectional views of the semiconductor device according to the first embodiment of the present invention in the steps of the method for fabricating the semiconductor device, which illustrate the method (Part 13).

Thus, the semiconductor device according to the present embodiment as illustrated in FIG. 23 is fabricated.

As described above, according to the present embodiment, ions are implanted into an upper part of the silicon germanium layer 100a, 100b to thereby make the upper part of the silicon germanium layer 100a, 100b amorphous, and the thus formed amorphous layer 101 and the nickel film 66 are reacted with each other to form the nickel silicide film 102a, 102b. In the amorphous layer 101, which is to react with the nickel film 66, i.e., the silicon germanium layer 100a, 100b in the part made amorphous, no crystal boundaries are present, and the silicidation homogeneously goes on, whereby the formation of regions on the silicon germanium layer 100a, 100b, in which the nickel silicide layer 102a, 102b is absent can be prevented. Because of no crystal faces in the part of silicon germanium layer 100a, 100b which has been made amorphous, the Ni $(Si_{1-x}Ge_x)_2$ crystals can be prevented from being formed in spikes. Thus, according to the present embodiment, even when the nickel silicide film 102a, 102b is formed by using the thin nickel film 66 to silicide the silicon germanium layer 100a, 100b, the sheet resistance can be low, and the junction leak current can be suppressed. Furthermore, according to the present embodiment, compression strain is applied to the channel regions of the silicon germanium layer 100a, 100b buried in the source/drain regions 64p, whereby the operation speed of the PMOS transistor 4 can be improved. Thus, the semiconductor device according to the present embodiment can have good electric characteristics.

A SECOND EMBODIMENT

The semiconductor device fabrication method according to a second embodiment of the present invention will be explained with reference to FIGS. 25A to 28. FIGS. 25A to 28 are sectional views of the semiconductor device according to the present embodiment in the steps of the method for fabricating the semiconductor device. The same members of the present embodiment as those of the method for fabricating the semiconductor according to the first embodiment are represented by the same reference numbers not to repeat or to simplify their explanation.

The method for fabricating the semiconductor device according to the present embodiment is characterized mainly in that an amorphous layer is formed by depositing the amorphous layer selectively on a silicon germanium layer, and the amorphous layer is silicided by using a nickel film.

First, the steps up to the step of forming a recess 104 in the source/drain diffused layer 64p including the recess forming step are the same as those of the method for fabricating the semiconductor device according to the first embodiment described above with reference to FIG. 11A to FIG. 19A, and their explanation will not be repeated.

Next, in the same way as in the semiconductor device fabrication method described above with reference to FIG. 19B, a silicon germanium layer ($Si_{1-x}Ge_x$ layer) 100a, 100b with a dopant impurity doped is epitaxially grown selectively on the gate electrode 54p and in the recess 104. Thus, the silicon germanium layer 100b is buried in the recess 104 of the source/drain diffused layer 64p in a PMOS transistor-to-be-formed region 98. The gate electrode 54p includes the silicon germanium layer 100a on a polysilicon film (see FIG. 25A).

Figure 26A:
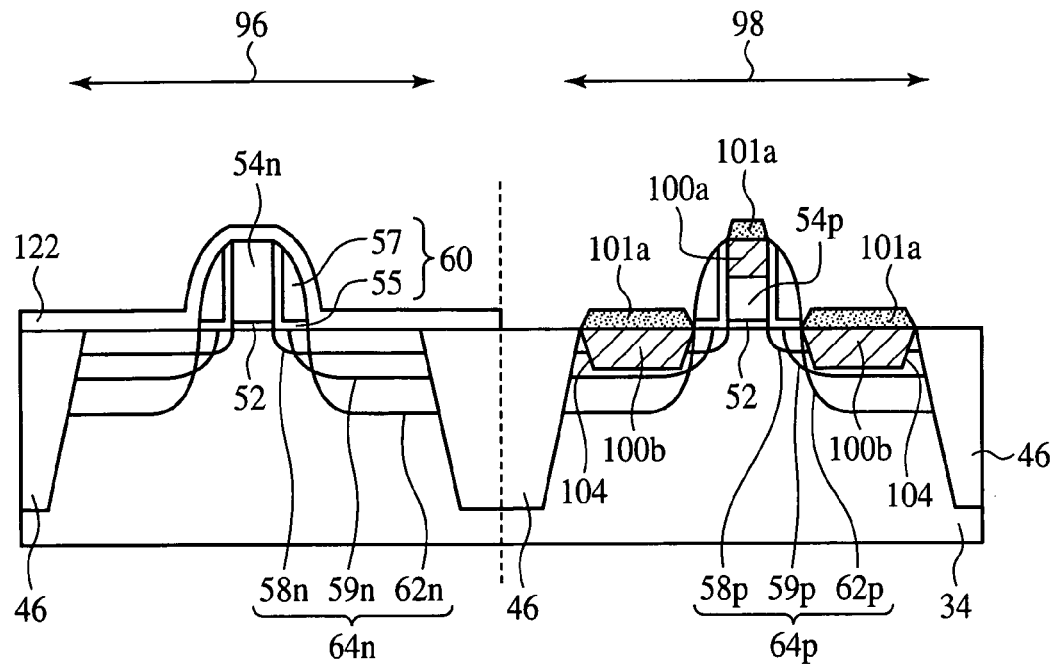
FIGS. 26A and 26B are sectional views of the semiconductor device according to the second embodiment of the present invention in the steps of the method for fabricating the semiconductor device, which illustrate the method (Part 2).
Figure 26B:
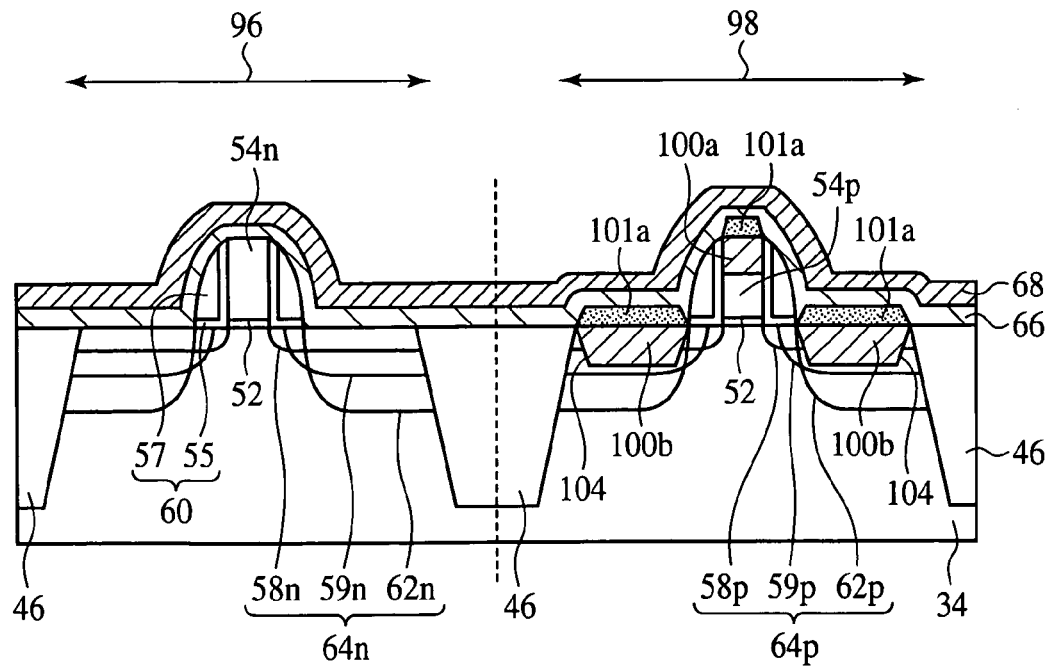

Next, an amorphous layer 101a is grown selectively on the silicon germanium layer 100a, 100b (see FIG. 26B). As the amorphous layer 101a, an amorphous silicon layer is grown. Conditions for the film formation are, as exemplified below. The pressure in the film forming chamber is, e.g., 80 Torr. As the raw material gas, silane ($SiH_4$) gas, for example, is used. The flow rate of the silane gas is, e.g., 50 sccm. The temperature for the film formation is, e.g., 550° C. The thickness of the amorphous layer to be formed is, e.g., 20 nm or below. Under these conditions, the amorphous layer 101a is formed thick selectively on the silicon germanium layer 100a, 100b. At this time, the amorphous layer 101a is often formed on the insulation films, i.e., on the device isolation regions 46, the sidewall insulation film 60 and the silicon oxide film 122, but the amorphous layer 101a formed on the insulation films is very thin. The very thin amorphous layer 101a formed on the insulation film is removed by the processing which will be described alter, and causes no problem.

Next, the processing for removing the thin amorphous layer 101a on the insulation films, i.e., on the device isolation regions 46, the sidewall insulation film 60 and the silicon oxide film 122 is made. Conditions for the processing for removing the thin amorphous layer 101a on the insulation films 46, 60, 122 are as exemplified below. The pressure in the chamber is, e.g., 10 Torr. As the $SiH_4$ gas, HCl gas and $H_2$ gas are fed into the chamber. The flow rate of the SiH4 gas is 50 sccm ($cm^3$). The flow rate of the HCl gas is 3 slm (standard liter per minute). The flow rate of the $H_2$ gas is 10 μm. Processing time is, e.g., 30 minutes. The processing under these conditions removes without failure the amorphous layer 101a present on the insulation films 46, 60, 122. The amorphous layer 101a formed thick on the silicon germanium layer 100a, 100b remain on the silicon germanium layer 100a, 100b in a sufficient thickness (see FIG. 26A). The thickness of the amorphous layer 101a left on the silicon germanium layer 100a, 100b is, e.g., about 10-20 nm.

Next, in the same way as in the semiconductor device fabrication method described above with reference to FIGS. 20B to 21A, a nickel film 66 and a protection film 68 are sequentially formed on the entire surface (see FIG. 26B).

Figure 27A:
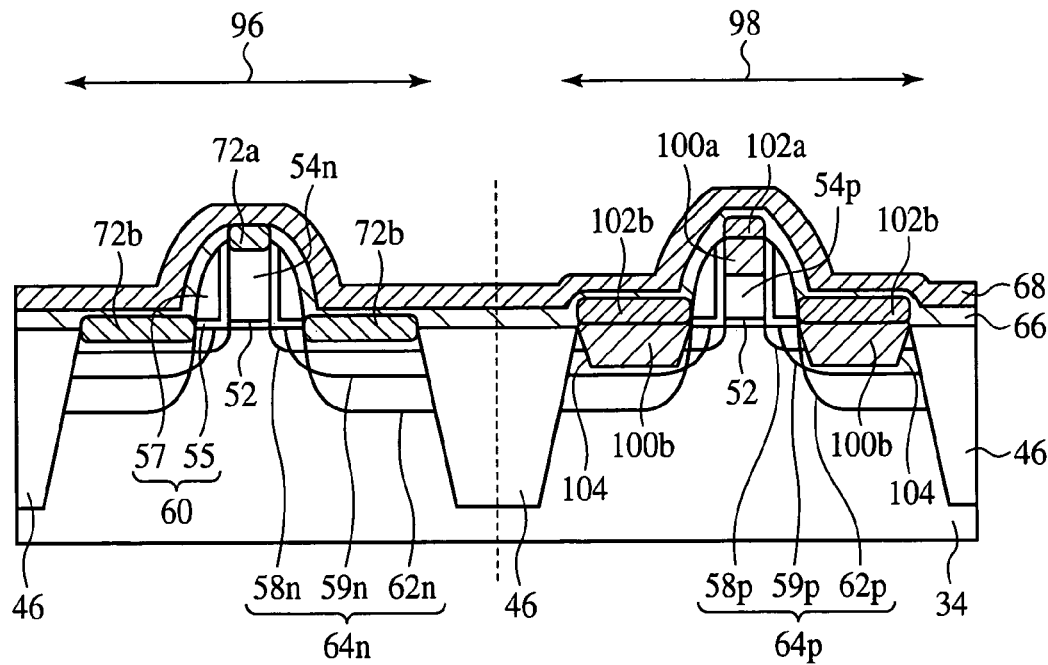
FIGS. 27A and 27B are sectional views of the semiconductor device according to the second embodiment of the present invention in the steps of the method for fabricating the semiconductor device, which illustrate the method (Part 3).

Then, thermal processing for reacting the nickel film 66 and the amorphous layer 101a with each other is made (see FIG. 27A). This thermal processing is made in the same way as in the semiconductor device fabrication method described above with reference to FIG. 21B. Thus, the nickel silicide film 102b of NiSi is formed on the silicon germanium layer 100a, 100b.

Figure 27B:
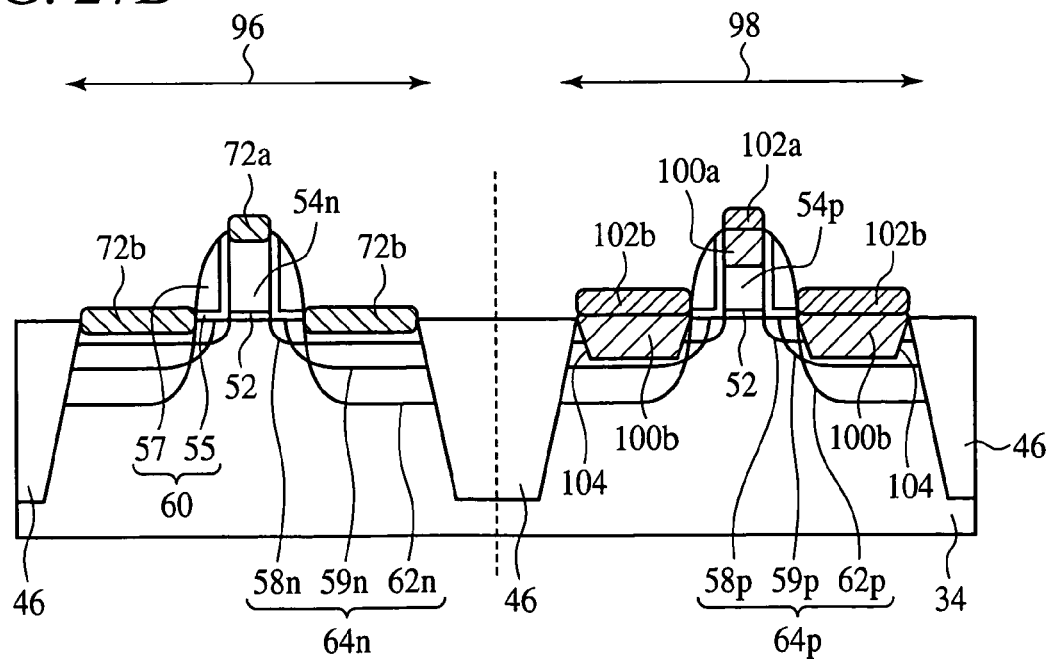
Figure 28:
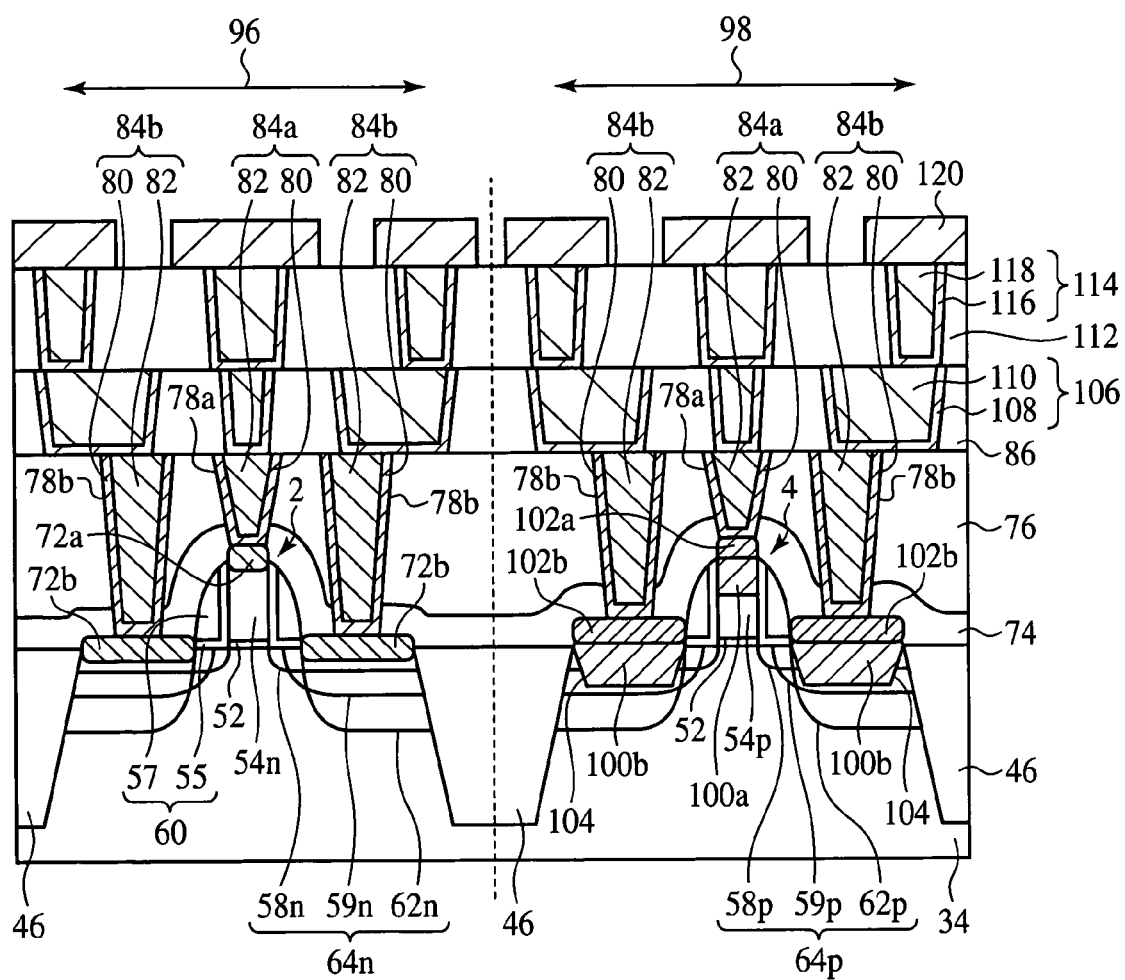
FIG. 28 is sectional views of the semiconductor device according to the second embodiment of the present invention in the steps of the method for fabricating the semiconductor device, which illustrate the method (Part 4).

The steps of the semiconductor fabrication method following the thermal processing are the same as those of the semiconductor device fabrication method described above with reference to FIGS. 22 and 23, and their explanation will not be repeated (see FIGS. 27B and 28).

As described above, the nickel silicide film 102a, 102b may be formed by forming the amorphous layer 101a selectively on the silicon germanium layer 100a, 100b and silicidng the amorphous layer 101a by using the nickel film 66.

In the present embodiment as well, no crystal boundaries are present in the amorphous layer 101a to react with the nickel film 60, and the silicidation homogeneously goes on. The homogeneous advance of the silicidation can prevent the generation of region where the nickel silicide film 102a, 102b is absent, in the silicon germanium layer 100a, 100b. According to the present embodiment as well, because of no crystal faces in the amorphous layer 101a to be silicided, the Ni $(Si_{1-x}Ge_x)_2$ crystals are prevented from being formed in spikes. Thus, the semiconductor device according to the present embodiment as well can have good electric characteristics.

A THIRD EMBODIMENT

The semiconductor device fabrication method according to a third embodiment of the present invention will be explained with reference to FIGS. 29A to 32. FIGS. 29A to 32 are sectional views of the semiconductor device according to the present embodiment in the steps of the method for fabricating the semiconductor device, which illustrate the method. The same members of the present embodiment as those of the method for fabricating the semiconductor device according to the first or the second embodiment are represented by the same reference numbers not to repeat to simplify their explanation.

The semiconductor device fabrication method according to the present embodiment is characterized mainly in that an amorphous layer is deposited on the entire surface, and the amorphous layer is patterned to form the amorphous layer on a silicon germanium layer, and such amorphous layer is silicided by using a nickel film.

First, the steps up to the step of forming a recess 104 in the source/drain diffused layer 64p including the recess forming step are the same as those of the semiconductor device fabrication method according to the first embodiment described above with reference to FIGS. 11A to 19A, and their explanation will not be repeated.

Next, in the same way as in the semiconductor device fabrication method described above with reference to FIG. 19B, a silicon germanium layer ($Si_{1-x}Ge_x$) layer 100a, 100b with a dopant impurity implanted is epitaxially grown selectively on the gate electrode 54p and in the recess 104. Thus, the silicon germanium layer 100b is buried in the recess 104 of the source/drain diffused layer 64p in a PMOS transistor-to-be-formed region 98. The gate electrode 54p includes the silicon germanium layer 100a on a polysilicon film.

Figure 29A:
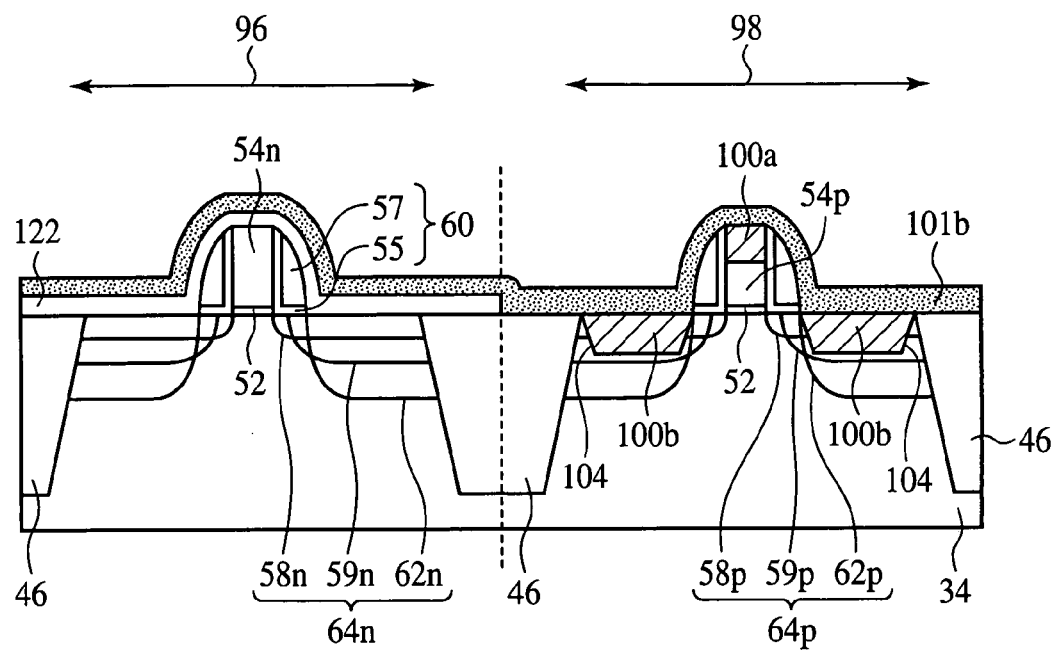
FIGS. 29A and 29B are sectional views of the semiconductor device according to a third embodiment of the present invention in the steps of the method for fabricating the semiconductor device, which illustrate the method (Part 1).
Figure 29B:
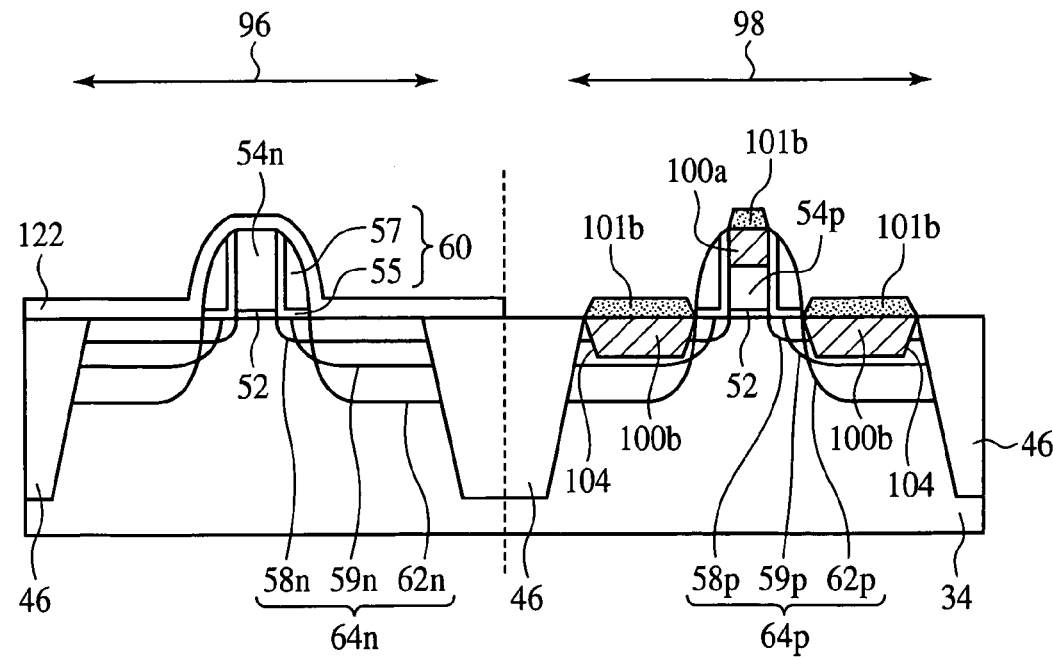

Then, an amorphous layer 101b is formed on the entire surface by CVD (see FIG. 29A). The material of the amorphous layer 101b is, e.g., amorphous silicon. The thickness of the amorphous layer is, e.g., 10-20 nm. Conditions for the film formation are as exemplified below. The film forming temperature is, e.g., 580° C. The pressure in the chamber is, e.g., 80 Torr. SiH4 gas and H2 gas are fed into the chamber. The flow rate of the SiH4 gas is 50 sccm. The flow rate of the H2 gas is, e.g., 5 slm. The processing period of time is, e.g., 5-6 minutes.

Then, the amorphous layer 101b is patterned by photolithography. The amorphous layer 101b is thus formed on the silicon germanium layer 100a, 100b (see FIG. 29B).

Figure 30A:
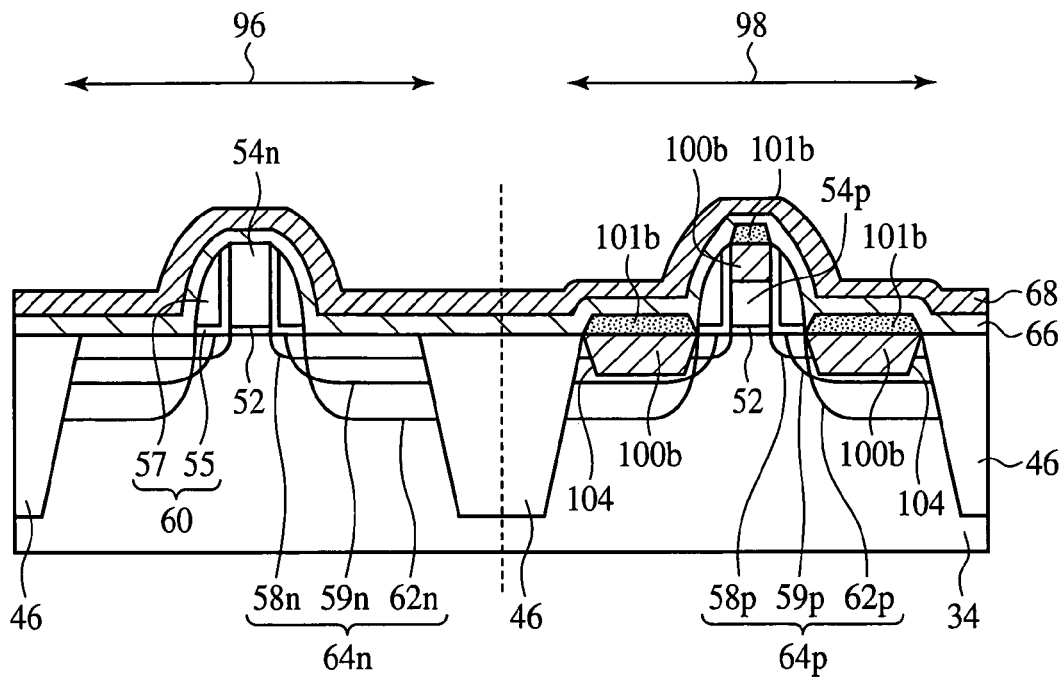
FIGS. 30A and 30B are sectional views of the semiconductor device according to the third embodiment of the present invention in the steps of the method for fabricating the semiconductor device, which illustrate the method (Part 2).
Figure 30B:
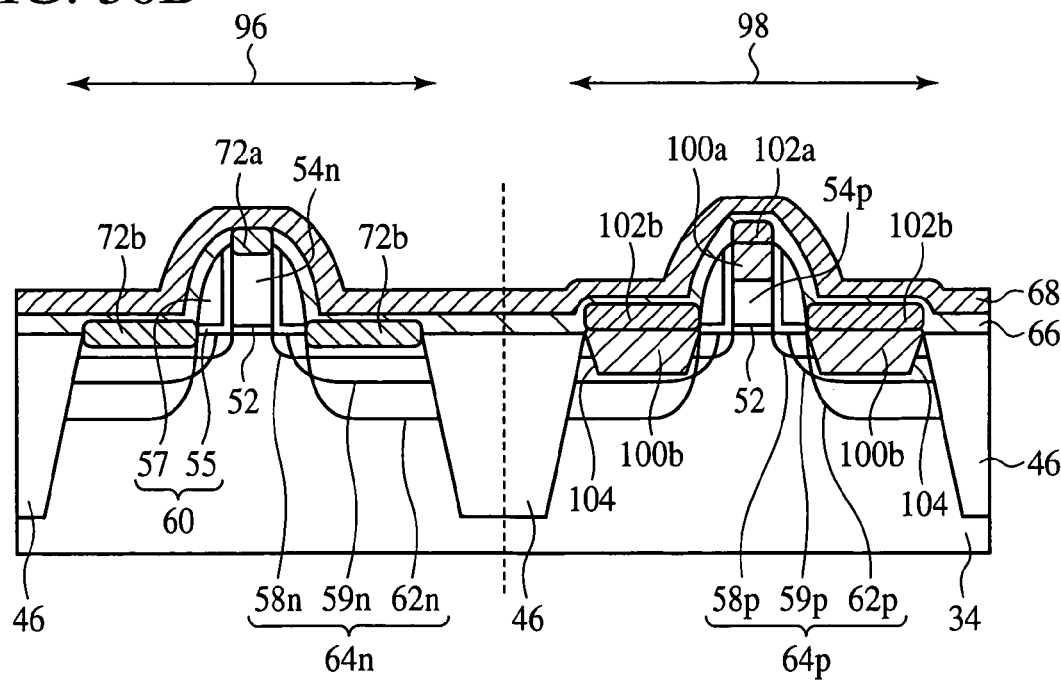

Next, in the same way as in the semiconductor device fabrication method described above with reference to FIGS. 20B and 21A, a nickel film and a protection film 68 are sequentially formed on the entire surface (see FIG. 30A).

Then, thermal processing for reacting the nickel film 66 and the amorphous layer 101a with each other is made. This thermal processing is made in the same way as in the semiconductor device fabrication method described above with reference to FIG. 21B. Thus, the nickel silicide film 102b of NiSi is formed on the silicon germanium layer 10a, 100b (see FIG. 30B).

Figure 31:
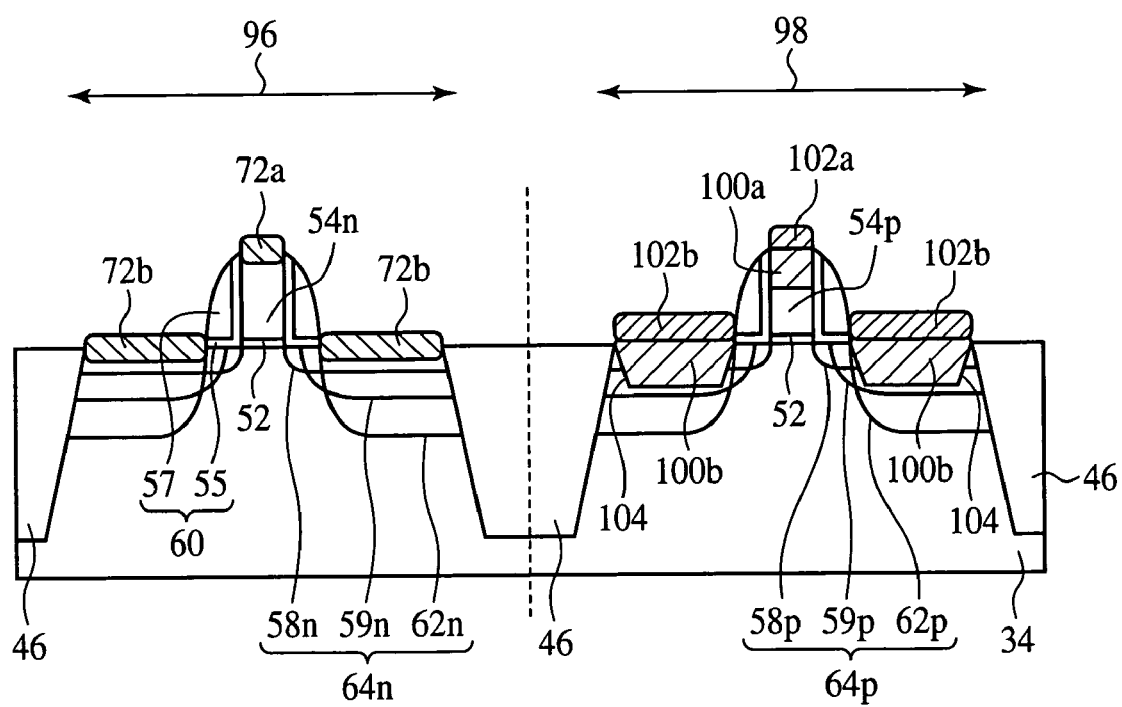
FIG. 31 is sectional views of the semiconductor device according to the third embodiment of the present invention in the steps of the method for fabricating the semiconductor device, which illustrate the method (Part 3).
Figure 32:
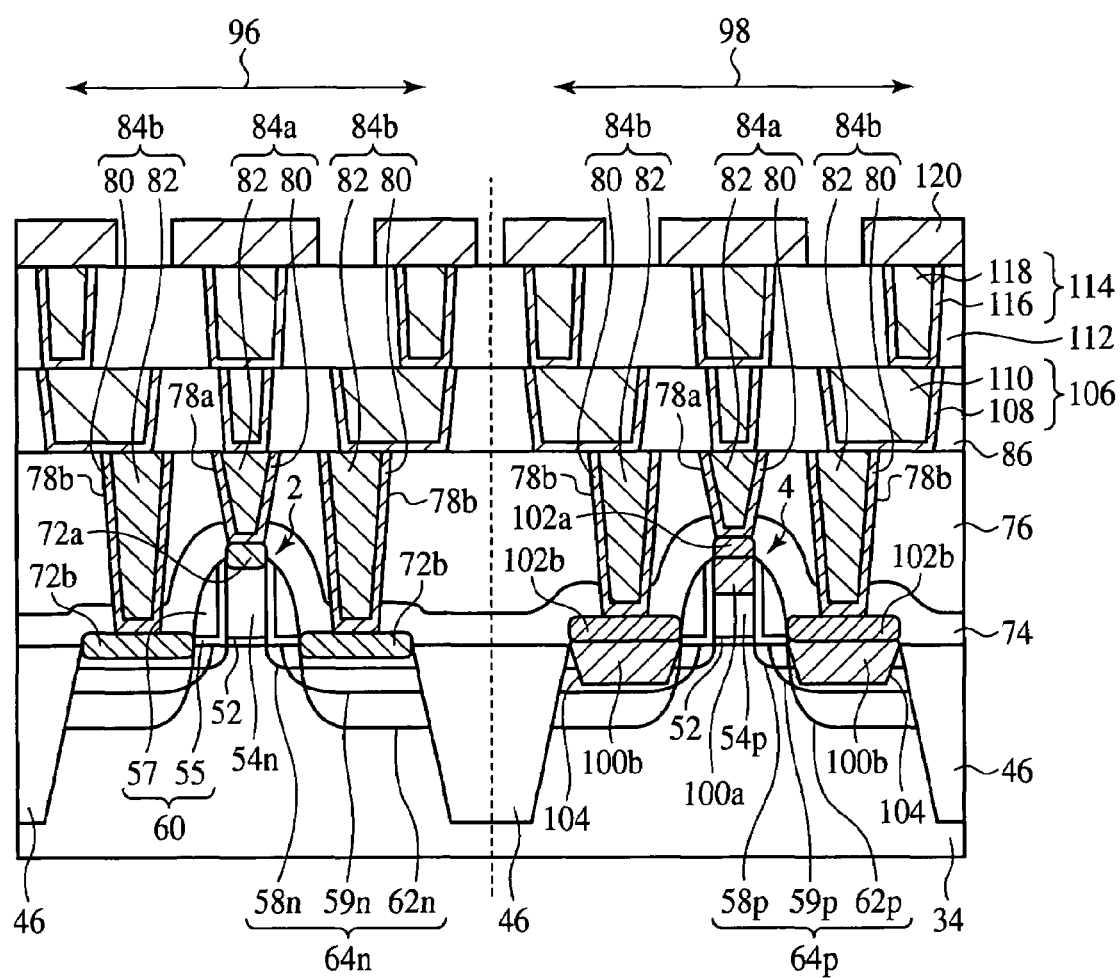
FIG. 32 is sectional views of the semiconductor device according to the third embodiment of the present invention in the steps of the method for fabricating the semiconductor device, which illustrate the method (Part 4).

The steps of the semiconductor fabrication method following the thermal processing are the same as those of the semiconductor device fabrication method described above with reference to FIGS. 22 and 23, and their explanation will not be repeated (see FIGS. 31 and 32).

As described above, it is possible the amorphous layer 101b is deposited on the entire surface and patterned to be thereby formed on the silicon germanium layer 100a, 100b, and such amorphous layer 101b is silicided by using the nickel film 66.

In the present embodiment as well, no crystal boundaries are present in the amorphous layer 101b to react with the nickel film 66, and the silicidation homogeneously goes on. The homogeneous advance of the silicidation can prevent the generation of region where the nickel silicide film 102a, 102b is absent, in the silicon germanium layer 100a, 100b. Because of no crystal faces in the amorphous layer 101b to be silicided, the Ni$(Si_{1-x}Ge_x)_2$ crystals are prevented from being formed in spikes. Thus, the semiconductor device according to the present embodiment as well can have good electric characteristics.

MODIFIED EMBODIMENTS

The present invention is not limited to the above-described embodiments and can cover other various modifications.

For example, in the second and the third embodiments, an amorphous silicon layer is formed as the amorphous layer 101a, 101b. However, the material of the amorphous layers 101a, 101b is not limited to amorphous silicon. For example, it is possible that an amorphous silicon germanium layer 101a, 101b is formed on the silicon germanium layer 100a, 100b, and the amorphous silicon germanium layer 101a, 101b is silicided by using a thin nickel film. In this case, the nickel silicide film 102a, 102b of Ni$(Si_{1-x}Ge_x)$ is formed on the silicon germanium layer 100a, 100b.

What is claimed is:

1. A semiconductor device fabrication method comprising the steps of:
   forming a gate electrode over a semiconductor substrate;
   forming a source/drain diffused layer in the semiconductor substrate on both sides of the gate electrode;
   forming a recess in the source/drain diffused layer on both sides of the gate electrode,
   burying a silicon germanium layer in the recess;
   forming an amorphous layer at an upper part of the silicon germanium layer;
   forming a nickel film on the amorphous layer; and
   making thermal processing to react the nickel film and the amorphous layer with each other to form a silicide film on the silicon germanium layer.

2. A semiconductor device fabrication method according to claim 1, wherein
   in the step of forming an amorphous layer, the amorphous layer is formed in a thickness of 20 nm or below.

3. A semiconductor device fabrication method according to claim 1, wherein
   in the step of forming a silicide film, the thermal processing is set on until the silicide film arrives at the crystallized silicon germanium layer.

4. A semiconductor device fabrication method according to claim 1, wherein
   in the step of forming an amorphous layer, the amorphous layer is formed by making the upper part of the silicon germanium layer amorphous by ion implantation.

5. A semiconductor device fabrication method according to claim 4, wherein
   in the step of forming an amorphous layer, Ar ions, Ge ions, Si ions, As ions, Sb ions, N ions, Xe ions or Kr ions are implanted into the upper part of the silicon germanium layer.

6. A semiconductor device fabrication method according to claim 1, wherein
   in the step of forming an amorphous layer, the amorphous layer is formed selectively on the silicon germanium layer.

7. A semiconductor device fabrication method according to claims 1, wherein
   in the step of forming an amorphous layer, the amorphous layer is formed on the semiconductor substrate and the silicon germanium layer and is patterned to thereby form the amorphous layer on the silicon germanium layer.

8. A semiconductor device fabrication method according to claim 6, wherein
   the amorphous layer is an amorphous silicon layer or an amorphous silicon germanium layer.

9. A semiconductor device fabrication method according to claim 7, wherein
   the amorphous layer is an amorphous silicon layer or an amorphous silicon germanium layer.

10. A semiconductor device fabrication method according to claim 1, wherein
    in the step of burying the silicon germanium layer, another silicon germanium layer is formed on the gate electrode,
    in the step of forming an amorphous layer, another amorphous layer is formed on said another silicon germanium layer,
    in the step of forming a nickel film, the nickel film is formed also on said another amorphous layer, and
    in the step of making thermal processing, the nickel film and said another amorphous layer are further reacted with each other to thereby form another nickel silicide film on said another silicon germanium layer.

11. A semiconductor device fabrication method according to claim 1, further comprising, after the step of forming a nickel silicide film,
the step of etching off an unreacted part of the nickel film selectively with a chemical liquid of a mixture of sulfuric acid and hydrogen peroxide.

12. A semiconductor device fabrication method according to claim 1, further comprising, after the step of forming a nickel silicide film,
the step of etching off an unreacted part of the nickel film selectively with a chemical liquid of a mixture of hydrochloric acid, hydrogen peroxide and water.

13. A semiconductor device fabrication method according to claim 1, wherein
in the step of forming a nickel film, the nickel film is formed by sputtering.

* * * * *